United States Patent
Laurin et al.

(10) Patent No.: US 9,312,411 B2
(45) Date of Patent: *Apr. 12, 2016

(54) CONNECTOR ASSEMBLIES FOR CONNECTING PANELS, PANELS WITH CONNECTOR ASSEMBLIES

(71) Applicant: SABIC Global Technologies B.V., Bergen op Zoom (NL)

(72) Inventors: Michael Matthew Laurin, Pittsfield, MA (US); Matthew Frank Niemeyer, North Chatham, NY (US); Scott Michael Davis, Pittsfield, MA (US); Charlie Woodrow Wood, Peru, MA (US); Przemyslaw Olszynski, Bergen op Zoom (NL)

(73) Assignee: SABIC GLOBAL TECHNOLOGIES B.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/871,391

(22) Filed: Apr. 26, 2013

(65) Prior Publication Data

US 2013/0283710 A1   Oct. 31, 2013

Related U.S. Application Data

(63) Continuation-in-part of application No. 13/456,626, filed on Apr. 26, 2012, now Pat. No. 9,074,372.

(51) Int. Cl.
*H01L 31/042* (2014.01)
*E04B 1/61* (2006.01)
(Continued)

(52) U.S. Cl.
CPC ............. *H01L 31/0422* (2013.01); *E04B 1/61* (2013.01); *E04D 3/06* (2013.01); *E04D 3/28* (2013.01);
(Continued)

(58) Field of Classification Search
CPC ............ E04D 3/06; E04D 3/366; E04D 3/08; E04D 3/28; E04B 1/61; F24J 2/526; F24J 2/5262; H01L 1/0422; F16B 5/0635
USPC ........ 52/173.3, 459–461, 463–468, 470–471, 52/57, 582.1, 584.1, 582.2, 506.08, 52/506.09, 506.1; 403/265, 270, 286, 331, 403/336, 339, 364, 380
See application file for complete search history.

(56) References Cited

U.S. PATENT DOCUMENTS

| 2,101,073 A | 12/1937 | Kotrbaty |
| 2,962,133 A | 11/1960 | Kivett et al. |

(Continued)

FOREIGN PATENT DOCUMENTS

| CH | 691319 A5 | 6/2001 |
| CN | 101308881 A | 11/2008 |

(Continued)

OTHER PUBLICATIONS

Swedish Patent No. 691319; Publication Date: Jun. 29, 2001; Abstract Only; 2 Pages.

(Continued)

*Primary Examiner* — Beth Stephan
(74) *Attorney, Agent, or Firm* — Cantor Colburn LLP

(57) ABSTRACT

In one embodiment, a connector assembly comprises: a connector; and a pair of side collectors, each comprising a connector engagement region having a size and geometry to mate with the connector so as to hold ends of two adjacent panels together; and a panel engagement region comprising a receiving area and having a size to attach onto an edge of the panel; and a clip, wherein the clip has a base that can be attached to a support, an engagement, and a stem extending therebetween, wherein the engagement has an extension projecting from a side of the engagement, wherein the panel engagement region further comprises an opening in a joint wall on a side of the panel engagement region opposite the receiving area, wherein the opening is configured to receive the extension of the engagement.

23 Claims, 29 Drawing Sheets

(51) Int. Cl.
*F24J 2/52* (2006.01)
*F16B 5/06* (2006.01)
*E04D 3/06* (2006.01)
*E04D 3/28* (2006.01)
*F16B 5/00* (2006.01)

(52) U.S. Cl.
CPC ............... *F16B 5/0635* (2013.01); *F24J 2/526* (2013.01); *H02S 20/00* (2013.01); *E04D 2003/285* (2013.01); *F16B 5/0084* (2013.01); *Y02E 10/47* (2013.01); *Y02E 10/50* (2013.01); *Y10T 29/49947* (2015.01); *Y10T 403/50* (2015.01)

(56) References Cited

U.S. PATENT DOCUMENTS

| | | | |
|---|---|---|---|
| 3,175,652 | A | 3/1965 | Brekell et al. |
| 3,185,267 | A | 5/1965 | Pavlecka |
| 3,210,808 | A * | 10/1965 | Creager ............... E04B 1/0046 16/225 |
| 3,310,919 | A | 3/1967 | Bue et al. |
| 3,367,076 | A | 2/1968 | O'Brien |
| 3,641,730 | A | 2/1972 | Meckstroth |
| 4,117,638 | A | 10/1978 | Kidd, Jr. et al. |
| 4,117,640 | A | 10/1978 | Vanderstar |
| 4,251,968 | A | 2/1981 | Raith et al. |
| 4,651,488 | A | 3/1987 | Nicholas et al. |
| 4,750,310 | A | 6/1988 | Holcombe |
| 4,828,132 | A | 5/1989 | Francis, Jr. et al. |
| 4,880,589 | A | 11/1989 | Shigemoto et al. |
| 5,070,662 | A | 12/1991 | Niese |
| 5,102,253 | A | 4/1992 | Pugliesi-Conti et al. |
| 5,134,827 | A | 8/1992 | Hartman |
| 5,155,952 | A | 10/1992 | Herwegh et al. |
| 5,247,773 | A | 9/1993 | Weir |
| 5,272,850 | A | 12/1993 | Mysliwiec et al. |
| 5,295,341 | A | 3/1994 | Kajiwara |
| 5,305,567 | A | 4/1994 | Wittler |
| 5,333,421 | A | 8/1994 | McKenna |
| 5,411,782 | A | 5/1995 | Jarvis et al. |
| 5,421,473 | A | 6/1995 | McCrossen |
| 5,613,338 | A | 3/1997 | Esposito |
| 5,787,642 | A | 8/1998 | Coyle et al. |
| 6,036,398 | A | 3/2000 | Theodorou |
| 6,122,879 | A | 9/2000 | Montes |
| 6,164,024 | A * | 12/2000 | Konstantin ...................... 52/200 |
| 6,182,403 | B1 | 2/2001 | Mimura et al. |
| 6,272,812 | B1 * | 8/2001 | Richardson .................. 52/800.1 |
| 6,289,646 | B1 | 9/2001 | Watanabe |
| 6,295,778 | B1 | 10/2001 | Burt |
| 6,314,704 | B1 | 11/2001 | Bryant |
| 6,336,304 | B1 | 1/2002 | Mimura et al. |
| 6,536,175 | B2 * | 3/2003 | Conterno ...................... 52/489.1 |
| 6,591,557 | B1 | 7/2003 | Thomsen et al. |
| 6,719,363 | B2 * | 4/2004 | Erlandsson et al. ..... 296/193.07 |
| 6,792,727 | B2 | 9/2004 | Krieger |
| 6,959,519 | B2 | 11/2005 | Adriaansen |
| 7,313,893 | B2 * | 1/2008 | Voegele, Jr. ...................... 52/461 |
| 7,441,379 | B2 * | 10/2008 | Konstantin ...................... 52/200 |
| 8,584,424 | B2 * | 11/2013 | Smith et al. .................. 52/588.1 |
| 2001/0005963 | A1 | 7/2001 | Richardson |
| 2002/0055572 | A1 | 5/2002 | Tai et al. |
| 2002/0066660 | A1 | 6/2002 | Ardrey et al. |
| 2002/0108343 | A1 | 8/2002 | Knauseder |
| 2003/0024199 | A1 | 2/2003 | Pervan et al. |
| 2004/0020150 | A1 * | 2/2004 | Fensel et al. ...................... 52/468 |
| 2004/0261336 | A1 * | 12/2004 | Konstantin ...................... 52/200 |
| 2007/0251183 | A1 * | 11/2007 | Thiagarajan et al. ........ 52/590.1 |
| 2009/0049771 | A1 | 2/2009 | Konstantin |
| 2010/0287858 | A1 * | 11/2010 | Israeli et al. .................. 52/220.7 |
| 2012/0051833 | A1 * | 3/2012 | Israeli et al. ...................... 403/49 |

FOREIGN PATENT DOCUMENTS

| | | | |
|---|---|---|---|
| CN | 201230287 Y | 4/2009 | |
| CN | 102254970 A | 11/2011 | |
| DE | 2824759 A1 | 12/1979 | |
| DE | 3214890 | 11/1983 | |
| DE | 3604951 A1 | 8/1987 | |
| EP | 0473321 A1 | 3/1992 | |
| EP | 0783064 A1 | 7/1997 | |
| EP | 0864708 A2 | 9/1998 | |
| EP | 0933490 A1 | 8/1999 | |
| EP | 1111153 A2 | 6/2001 | |
| GB | 206744 A | 11/1923 | |
| GB | 2386636 A | 9/2003 | |
| GB | 2429742 B | 1/2008 | |
| JP | 6487330 A | 3/1989 | |
| JP | H06264571 A | 9/1994 | |
| JP | 2000129831 A | 5/2000 | |
| JP | 2005-277216 | * 10/2005 | ............ H01L 31/042 |
| JP | 2007023515 A | 2/2007 | |
| WO | 0037846 A1 | 6/2000 | |
| WO | WO 0065172 A1 | * 11/2000 | |
| WO | 2006095201 A1 | 9/2006 | |
| WO | 2006135819 A2 | 12/2006 | |
| WO | 2008152637 A1 | 12/2008 | |
| WO | 2010013233 A2 | 2/2010 | |

OTHER PUBLICATIONS

European Patent No. 0783064; Date of Publication: Jul. 9, 1997; Abstract Only; 1 page.
German Patent No. 2824759; Publication Date: Dec. 13, 1979; Machine Translation—Abstract Only; 2 pages.
German Patent No. 3214890; Publication Date: Nov. 3, 1983; Abstract Only; 1 Page.
German Patent No. 3604951 (A1); Publication Date: Aug. 20, 1987; Abstract Only; 1 Page.
Branson 2013, "Part Design for Ultrasonic Welding"; Ultrasonic Plastic Joining; 2013.
International Search Report; International Application No. PCT/US2013/038413; International Filing Date: Apr. 26, 2013; Mailing Date: Jul. 17, 2013; 4 Pages.
Written Opinion of the International Searching Authority; International Application No. PCT/US2013/038413; International Filing Date: Apr. 26, 2013; Mailing Date: Jul. 17, 2013; 6 Pages.
Chinese Patent No. 102254970 (A); Publication Date Nov. 23, 2011; Abstract only; 2 pages.
Chinese U.S. Pat. No. 201230287 (Y); Publication Date: Apr. 29, 2009; Abstract Only; 1 page.
Chinese Publication No. 101308881 (A); Publication Date: Nov. 19, 2008; Abstract Only; 1 page.

\* cited by examiner

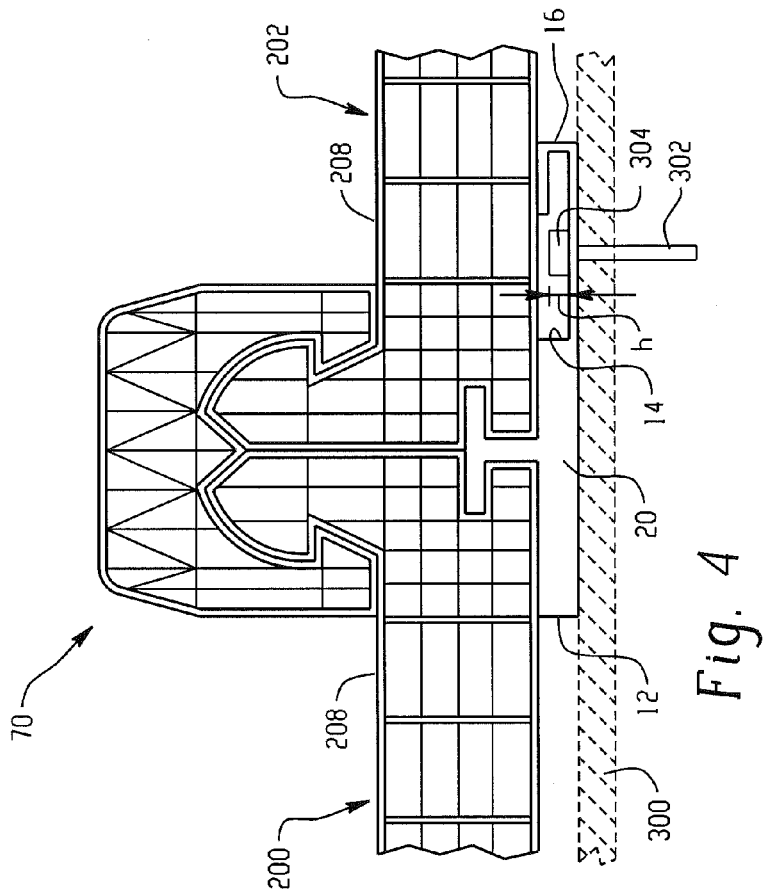
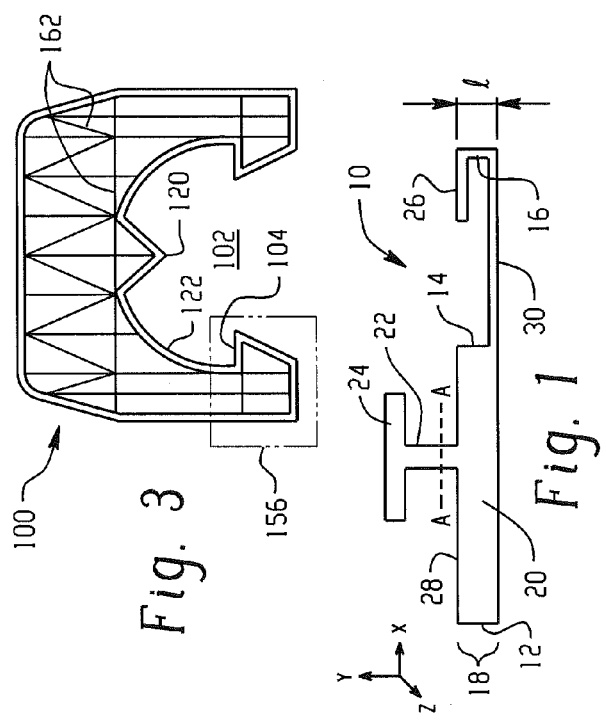
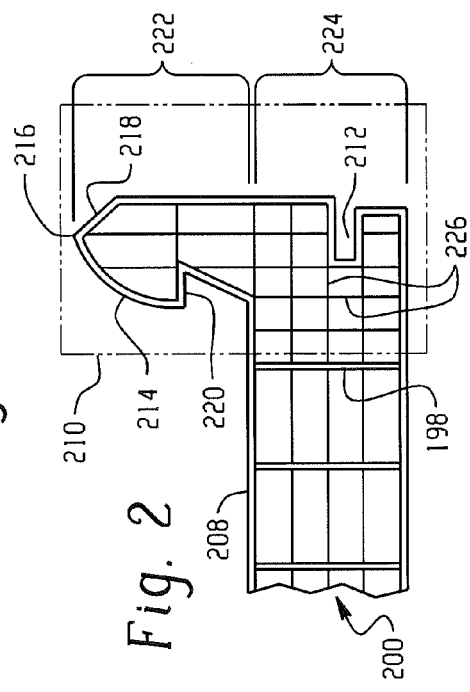

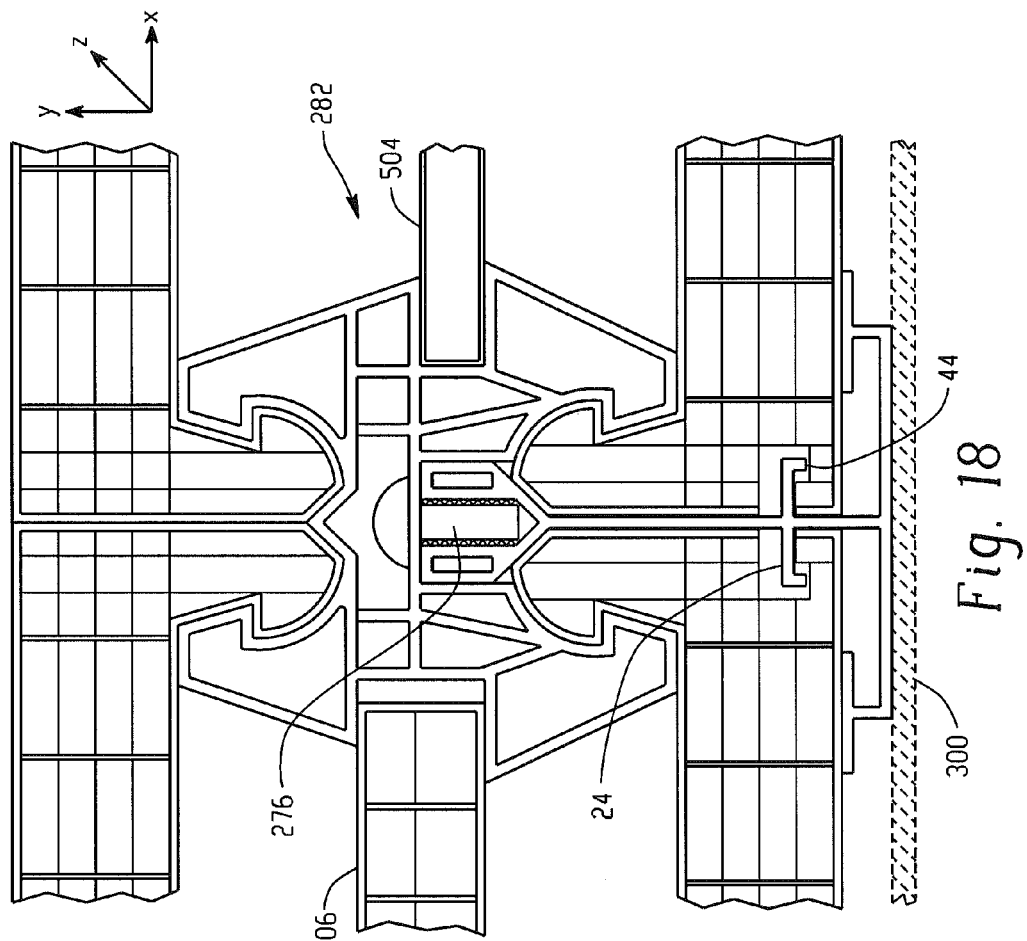
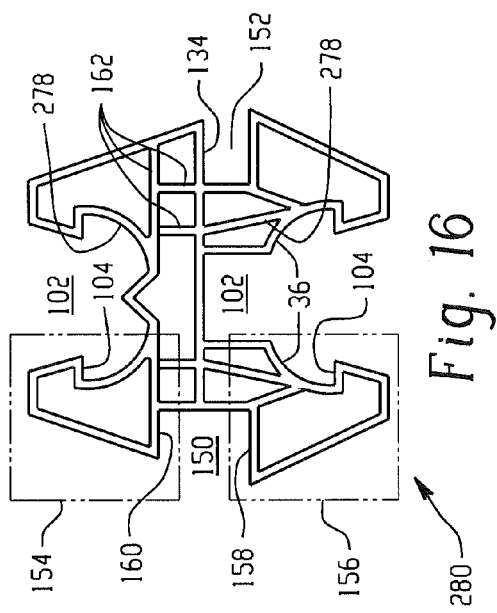
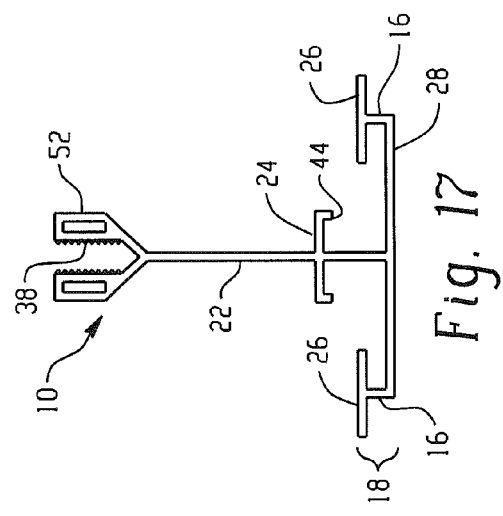

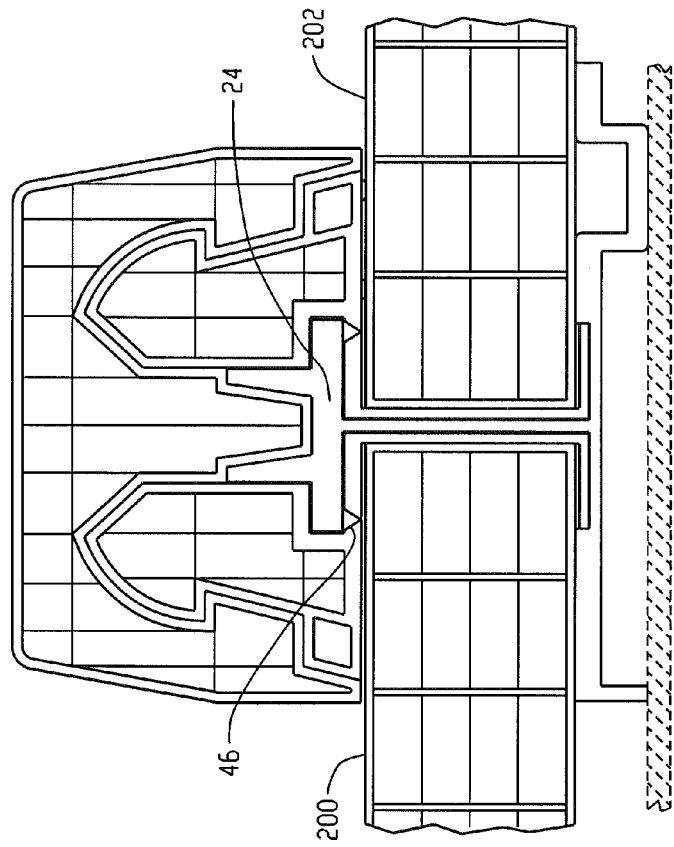
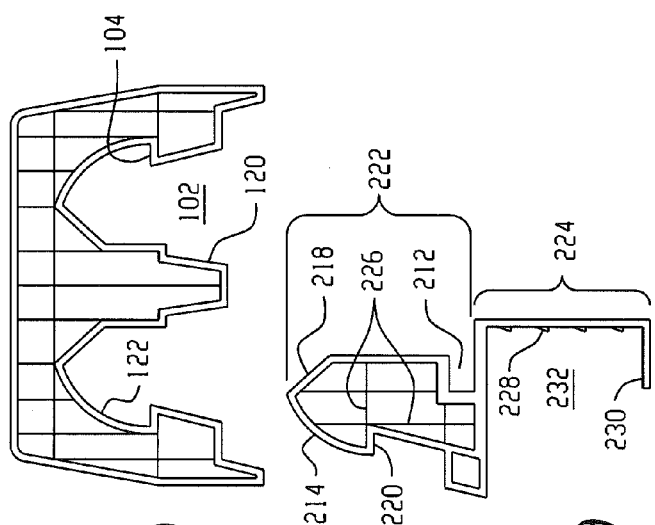
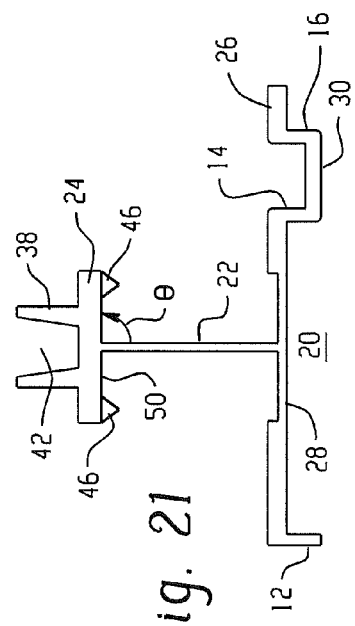

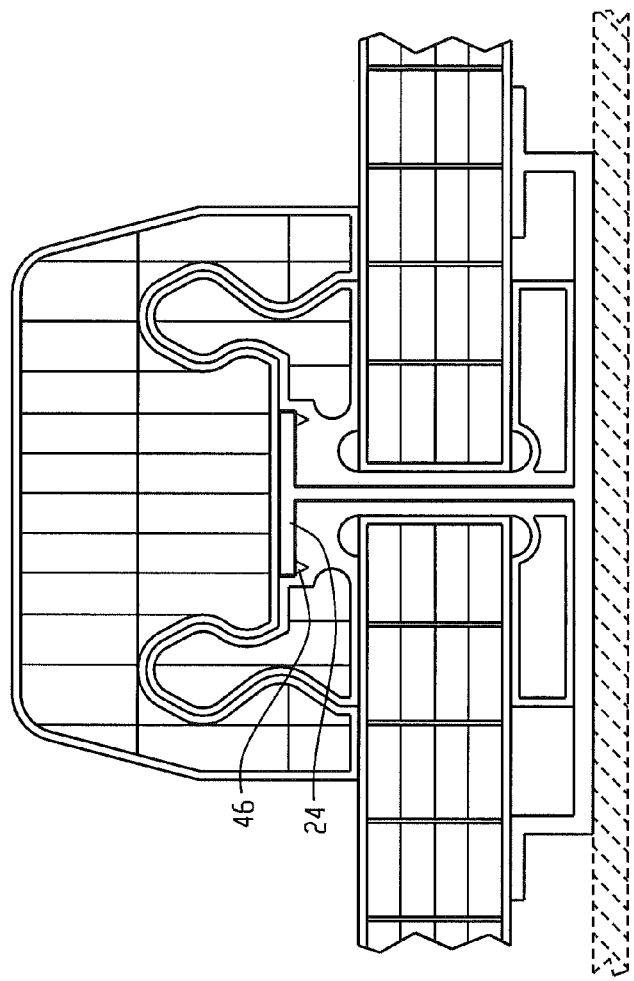
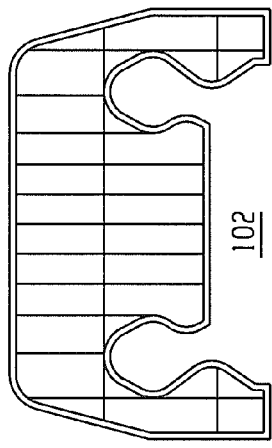
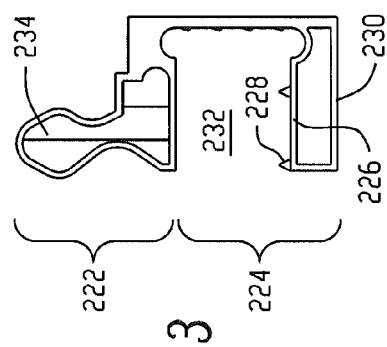
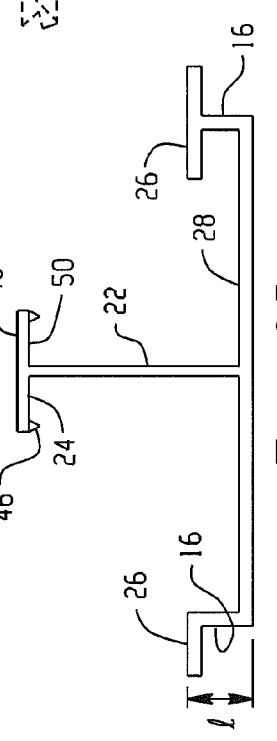

CONNECTOR ASSEMBLIES FOR CONNECTING PANELS, PANELS WITH CONNECTOR ASSEMBLIES

CROSS-REFERENCE TO RELATED APPLICATION

This application claims the benefit of U.S. Non Provisional patent application Ser. No. 13/456,626 filed Apr. 26, 2012. The related application is incorporated herein by reference.

TECHNICAL FIELD

The present disclosure generally relates to connectors and collectors for connecting panels, and panels comprising the assemblies.

BACKGROUND

In the construction of naturally lit structures, such as greenhouses, pool enclosures, solar roof collectors (e.g., photovoltaic modules), stadiums and sunrooms, glass panel roofs have been employed to allow natural light to shine therein. The glass panels themselves can be mounted in frame-like enclosures that are capable of providing a watertight seal around the glass panel and provide a means for securing the panel to a structure. These frame-like enclosures also provide for modular glass roofing systems that can be assembled together to form the roof.

Glass panel roofing systems generally provide good light transmission and versatility. However, the initial and subsequent costs associated with these systems limits their application and overall market acceptance. The initial expenses associated with glass panel roofing systems comprise the cost of the glass panels themselves as well as the cost of the structure, or structural reinforcements, that are employed to support the high weight of the glass. After these initial expenses, operating costs associated with the inherently poor insulating ability of the glass panels can result in higher heating expenses for the owner. Yet further, glass panels are susceptible to damage caused by impact or shifts in the support structure (e.g., settling), which can result in high maintenance costs. This is especially concerning for horticultural applications wherein profit margins for greenhouses can be substantially impacted due to these expenditures.

As a result, multiwall polymeric panels (e.g., polycarbonate) have been produced that exhibit improved impact resistance, ductility, insulative properties, and comprise less weight than comparatively sized glass panels. As a result, these characteristics reduce operational and maintenance expenses. Polymeric panels can also be formed as solid panels. Solid panels are solid plastic between their front and rear faces, and are useful where high impact resistance, high clarity, and/or the ability to thermoform the panel is desired. Multiwall panels have voids between their front and rear faces, e.g., the panel may be extruded (e.g., as a honeycomb) with an array of passages extending along the extruded length of the panel. Multiwall panels are useful where a high insulation value, lightweight, and easy installation, are desired.

For ease of design and assembly, multiwall panels can be produced in modular systems. The modular systems comprise multiwall panels with integral panel connectors, wherein the panel connector assemblies are employed to join the panels together and/or secure the panels to a structure on which they are employed. Standard panels can also be used, which are formed continuously and uniformly, i.e., they are extruded slabs and are cut to size and installed in the same manner as glass. These standard panels require a frame or the like to hold them in place.

Modular panels are advantageous for their extreme ease of installation, but are disadvantageous owing to their limited versatility in that modular panels cannot be cut to a desired size if such cutting involves loss of a connecting edge, because the modular panel will no longer be readily connectable to other panels at the cut edge. As a result, if a panel with an unusual or non-standard width is desired, a new extrusion die must be commissioned, at great expense, so as to be able to extrude panels of the desired width, and having the desired connecting edges. Further, modular panels are naturally limited to use with modular panels having complementary attachment structure (i.e., a tongue-and-groove panel will connect to other tongue-and-groove panels having the same tongue/groove configuration, but will not connect to standing seam panels). Standing seam generally refers to a panel with an integrated side collector adjoined to another panel with the use of a connection system. Thus, greater flexibility in the size of the modular panels, without the requirement for expensive equipment and retooling, and the ability to connect to a variety of panels is desired.

Additionally, modular panels can be subject to high wind loads depending upon the structure and location on which they are installed, and must be able to withstand certain live loads (e.g., wind loads) and static loads (e.g., snow loads) in order to satisfy various building codes (e.g., be able to support 3 feet (0.9 meter) of wet snow and/or be able to withstand wind loads of 80 miles per hour (mph) to 280 mph (130 kilometers per hour (kph) to 450 kph)). Wind loads can create negative forces which can pull a modular panel off its supports and thus, lead to premature failure of the modular panel.

A connector assembly that can withstand high wind loads and not allow a panel to be pulled from its supports is continually desired.

BRIEF DESCRIPTION

Disclosed, in various embodiments, are side collectors and connector assemblies, and methods for connecting panels with the side collectors and/or connector assemblies, and panels using the side collectors and/or connector assemblies.

In one embodiment, a connector assembly comprises: a connector; and a pair of side collectors, each comprising a connector engagement region having a size and geometry to mate with the connector so as to hold ends of two adjacent panels together; and a panel engagement region comprising a receiving area and having a size to attach onto an edge of the panel; and a clip, wherein the clip has a base that can be attached to a support, an engagement, and a stem extending therebetween, wherein the engagement has an extension projecting from a side of the engagement, wherein the panel engagement region further comprises an opening in a joint wall on a side of the panel engagement region opposite the receiving area, wherein the opening is configured to receive the extension of the engagement.

In one embodiment, a side collector comprises: a connector engagement region comprising a head having a size and geometry to mate with a panel connector; a panel engagement region comprising a receiving area having an energy director extending into the receiving area, and having a size to attach onto an end of the panel; and a clip engagement region comprising an opening, and having a size to accommodate an extension on a side of an engagement of a clip.

In one embodiment, a panel assembly comprises: a connector assembly, comprising a connector; a pair of side collectors, each comprising a connector engagement region; and a panel engagement region comprising a receiving area; and a clip, wherein the clip has a base that can be attached to a support, an engagement, and a stem extending therebetween, wherein the engagement has an extension protruding from a side of the clip, wherein the panel engagement region further comprises an opening in a joint wall on a side of the panel engagement region opposite the receiving area, wherein the opening is configured to receive the extension of the engagement; a panel located in each panel engagement region; and wherein the connector is mated with the connector engagement region of the side collectors so as to hold ends of the panels together.

In one embodiment, a method of making a panel assembly, comprises: attaching a first panel to a second panel with a connector assembly, wherein the connector assembly comprises a connector; and a pair of side collectors, each comprising a connector engagement region having a size and geometry to mate with the connector so as to hold ends of two adjacent panels together; and a panel engagement region comprising a receiving area and having a size to attach onto an edge of the panel; and a clip, wherein the clip has a base that can be attached to a support, an engagement, and a stem extending therebetween, wherein the engagement has an extension projecting from a side of the engagement, wherein the panel engagement region further comprises an opening in a joint wall on a side of the panel engagement region opposite the receiving area, wherein the opening is configured to receive the extension of the engagement.

In one embodiment, a method of making a photovoltaic module assembly comprises: attaching a first photovoltaic module to a second photovoltaic module with a connector assembly, wherein the connector assembly comprises a connector; and a pair of side collectors, each comprising a connector engagement region having a size and geometry to mate with the connector so as to hold ends of two adjacent panels together; and a panel engagement region comprising a receiving area and having a size to attach onto an edge of the panel; and a clip, wherein the clip has a base that can be attached to a support, an engagement, and a stem extending therebetween, wherein the engagement has an extension projecting from a side of the engagement, wherein the panel engagement region further comprises an opening in a joint wall on a side of the panel engagement region opposite the receiving area, wherein the opening is configured to receive the extension of the engagement.

In one embodiment, an assembly comprises: a connector comprising two cavities defined by flexible walls, wherein each of the cavities has a geometry and is configured to mate with connector engagement regions from a pair of side collectors; a header located between the two cavities; and a first slot on a side of the connector and between the cavities, wherein the first slot has a size and geometry to receive an end of a panel without a side collector, wherein the cavities enable two sets of panels to be stacked and connected with the connector; and a clip, wherein the clip has a base that can be attached to a support, an engagement, and a stem extending therebetween, wherein the stem diverges to a receiver located on an end of the stem opposite the base, wherein the engagement has an extension projecting from a side of the engagement, wherein a panel engagement region on the side collectors comprises an opening in a joint wall on a side of the panel engagement region opposite a receiving area, wherein the opening is configured to receive the extension of the engagement.

BRIEF DESCRIPTION OF THE DRAWINGS

The following is a brief description of the drawings, which are presented for the purposes of illustrating the exemplary embodiments disclosed herein and not for the purposes of limiting the same. It is noted that various elements of the embodiments are interchangeable with other embodiments as long as collectors and if used, a clip, are mateable and/or, for side seams, the connector and associated collectors, and if used, a clip, are mateable, as would be readily understood. However, for simplicity, not every single combination has been illustrated.

FIG. 1 is a front view of a clip for use in assembling a structure.

FIG. 2 is a cross-sectional end view of a panel with an integrated side collector.

FIG. 3 is a front view of a connector for use in assembling a structure.

FIG. 4 is a front view of FIG. 1 to FIG. 3 assembled.

FIG. 16 is a front view of a double-sided connector with slots for receiving additional panels and for receiving side collectors integrated with a clip in one area and not integrated with a clip in another area.

FIG. 17 is a front view of a clip for use in assembling a structure.

FIG. 18 is a front view of FIG. 16 and FIG. 17 assembled.

FIG. 19 is a side view of an un-integrated side collector.

FIG. 20 is a front view of a connector for use in assembling a structure.

FIG. 21 is a front view of a clip for use in assembling a structure.

FIG. 22 is a front view of FIG. 19 to FIG. 21 assembled including panels.

FIG. 23 is a side view of a panel and a side collector separate from the panel.

FIG. 24 is a front view of a connector for use in assembling a structure.

FIG. 25 is a front view of a clip for use in assembling a structure.

FIG. 26 is a front view of FIG. 23 to FIG. 25 assembled.

DETAILED DESCRIPTION

Figure 5:
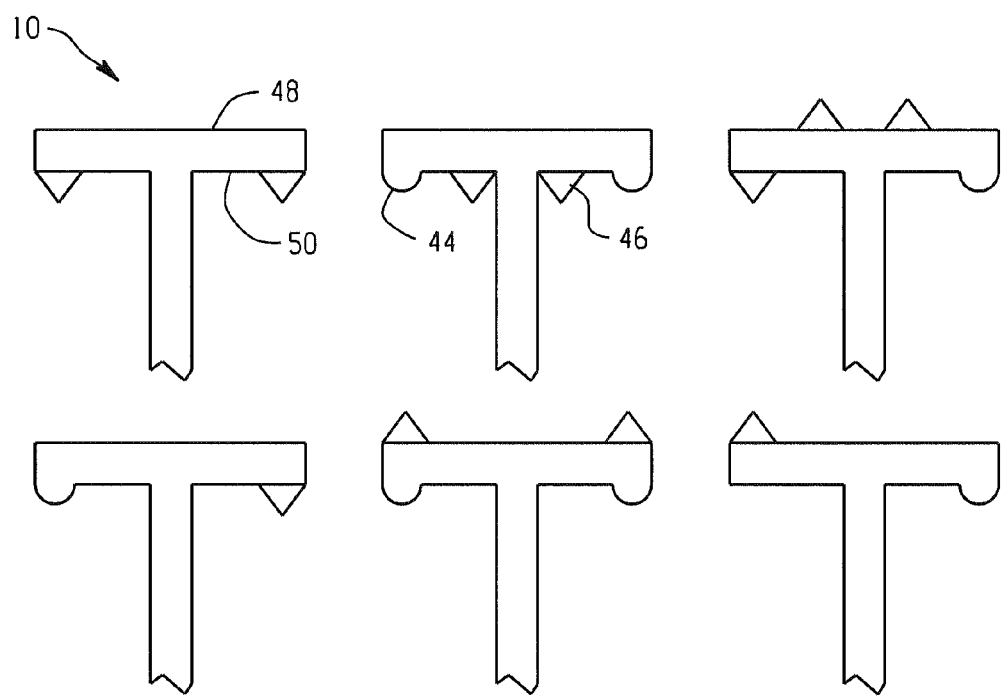
FIG. 5 is a front view of various designs for the clip of FIG. 1 along line A-A.

Disclosed herein are various embodiments of connector assemblies, e.g., connector(s) and collector(s), and clip(s), and panels using connector assemblies, including panels comprising photovoltaic panels. The connectors can attach to a support via the clip, where the clip can comprise an extension protruding from an edge of a cross-member. The extension can, when used to attach multiple panels together, assist preventing panels from spreading away from one another when a load is applied. In other words, the extension can assist in keeping the panel assembly intact by effective resistance to positive and negative wind load force, thereby preventing separation of the panels. The clips disclosed herein comprising an extension can hold the connector assembly together at higher wind loads than clips without an extension. The connectors can also be single or double sided; e.g., can be capable of engaging one or two sets of collectors, and optionally of engaging the ends of one or two additional panels with no collectors. The collectors can be integral with the panel (formed as part of the panel, e.g., as a single, unitary component), or separate from the panel as an independent component. If the collector is a separate component, many different width panels (e.g., measured in the X direction) can be used with the same collector and connector. Additionally, many different thicknesses (measured in the Y direction) and/or different width panels can be used with the same connector by using different, separate collectors. Various designs can be included to attach other components, for example, photovoltaic panels having frames designed to accept connectors (e.g., standing seam connectors) for ease of assembly. Additionally, the clips can be designed to enable the panels to be level when assembled (in the Y direction). The clips can also be designed to engage with the panels so as to not allow separation between the panel and the clip in the X direction when subjected to a load. Optionally, a single clip design can be used with several collector or integrated collector designs.

The connector assemblies generally comprise a connector, a side collector, and a clip for attaching panels together. The connectors and collectors are designed as mating pairs with one acting as the male and the other as the female connector. In many of the embodiments illustrated in the figures, the connector is illustrated as the female component, while the collector is illustrated as the male component. It is noted that this is merely for illustration and ease of discussion. The opposite configuration is also covered herein and contemplated hereby, wherein the connector is the male component and the collector is the female component (e.g., see FIG. 27). Therefore, the discussion of the cavity for the connector and the connector engagement region for the collector can readily be reversed and is hereby understood.

The connector can be designed with a cavity that has a size and shape to mate with a pair of side collectors (from adjacent panels) in order to hold the panels together. The specific size and shape of the cavity is dependent upon the size and shape of the side collectors. Desirably, the connector securely attaches to the panels, over the side collectors. In other words, the size of the cavity can be about equal to the size of the side collectors such that when the connector is assembled onto the side collector, physical contact between the outer surface of the side collector and the inner surface of the cavity is attained (e.g., over greater than or equal to 80% of the outer surface of the collector). It is noted that when a clip is utilized having an engagement (e.g., cross-member 24 in FIG. 1, receiver 52 in FIG. 17) that will be located between the connector and the collector, the size of the collector inner surface is sufficient to enable the engagement to be located between the connector and collector. For ease of installation and minimization of the use of fasteners, the connectors can be designed to snap-fit onto the collectors (e.g., see FIG. 4), to slide onto the collectors from an end of the panel (e.g., see FIG. 26), and/or to otherwise attach. It is contemplated, however, that a sliding mechanism can also be used to attach the connectors to the collectors.

It is noted that the connector is complementary to the combination of collectors to which it connects. However, both collectors do not need to be identical. Different collectors can be used on each panel so long as the connector is designed to receive that combination of collectors.

Further, panels using the side collector(s) (and/or connectors) disclosed herein can have all of their edges—not just two opposing edges—bearing attachment structures. (See FIG. 36) For example, panels for a wall might bear edge connectors with standing seams where the horizontal panel edges are to be joined and edge connectors with tongue and groove attachments where the vertical panel edges are to be joined.

For example, referring to FIGS. 1-4, the connector 100 has a cavity (interior portion 102) with a size and shape complementary to two side collectors 210 arranged adjacent to one another such that the collector assembly (two adjacent side collectors) can be inserted into the cavity 102. For example, such that the peaks 216 and slopes 218 of the adjacent side collectors form a valley that receives the connector protrusion 120. Similarly, complementary flange 104 and ledge 220 of the connector 100 and side collector 210, respectively, can be in physical contact when the connector is attached to the panels.

Some embodiments of the connectors 100 are "double" connectors, i.e., they have cavities 102 on two opposite sides for receiving pairs of side collectors (e.g., see FIG. 16). In these embodiments, a cavity 102 is located on each side of the header 134. Each of these cavities 102 comprises the flanges 104 to engage the ledges 220 of the side collectors 210 (e.g., see FIG. 2). As with the other connectors 100, for example as illustrated in FIG. 3, each cavity 102 of the double connectors are configured to mate with a specific pair of side collectors 210 and therefore has a complementary inner geometry that matches the outer geometry of the side collectors (or, as is mentioned above wherein the connector is the male element, the connector will have a complementary outer geometry to match the inner geometry of the collector, wherein the collector will extend from the end of the panel). For example, as illustrated in FIG. 16, wing(s) 36 can be present that mate with receiver(s) 52 extending from stem 22 on the clip 10. As is clear from the exemplary embodiments illustrated in the figures, each of the connectors in the double connector does not have to be identical. A combination of different connectors can be used. As can be seen from FIG. 16, the connector can have different shaped cavities 102 that are configured to receive the same shaped pairs of side collectors. It is also contemplated that different shaped pairs of collectors can be received in each cavity that is shaped accordingly. Here, the difference in shape is to enable the additional receipt into one of the cavities, the clip engagement (e.g., cross-member(s) 24 and/or receiver(s) 52).

In addition to different cavity geometries, the connectors can comprise different outer geometries, thereby enabling them to receive additional panel(s), e.g., panel(s) that do not have a side collector. Optionally, slot(s) (e.g., slots 150,152) can be formed between the cavities 102 (see e.g., FIG. 16). The size and geometry of these slot(s) is dependent upon the thickness of the panel(s) intended to be inserted into the slot(s). Note, it can be desirable to only have slot(s) on the side(s) of the double connector intended to receive additional panels. The presence of a panel in the slot stabilizes the sides 154,156 of the double connector, preventing flexing of the side(s) after installation of the panel. In other words, while the side collectors 210 are inserted into the cavities 102, the sides 154,156 (accordingly), of the double connector, are forced outward, causing the edges 158,160 (accordingly) defining the slot(s) to move into the slot. Once the flange 104 passes the end of the slide region 214 to the ledge 220, the sides 154,156 move back out of the slot(s) 150,152. Hence, if a snap-fit arrangement is employed, the side collectors are inserted into the double connector prior to the insertion of the additional panels. Furthermore, if a fastener is employed, the set of side collectors located between the connector and the support are inserted first to enable the attachment of the fastener 302 to arm 30. Then the second set of side collectors are inserted into the open cavity 102 prior to the insertion of the additional panel(s). The additional panels can have a thickness that enables a compression fit in the slot, e.g., without damaging the end of the panel. Such a fit will prevent inadvertent removal of the panel from the slot and will stabilize the sides 154,156 against movement upon the application of force to the panels.

As is illustrated in FIG. 18 and mentioned above, the end of the panels (without collectors) can be inserted into the slot(s). This creates an arrangement, in the Y direction (see coordinate system labeled in FIG. 18), of panels with collectors (e.g., first set of panels), gap (e.g., fluid gap such as air), panels without collector, gap (e.g., fluid gap such as air), panels with collectors (second set of panels). Since the sizes of the slots are different, different thickness panels are located on each side of the double collector. In embodiments that employ the double connector, a clip can optionally be employed to provide attachment of the first set of panels to a support 300. In addition, the clip may further comprise member(s) 38 configured to receive fastener(s) 302. Hence, one or both of the connectors of the double connector can be configured to receive fastener(s) to enable further securement of the connectors (and hence the panels) to the support 300. In other words, in addition to the snap connection via the side collectors of the first set of panels, the retention of the connectors can be further enhanced via direct attachment of the header of the double connector to the member(s) 38 of the clip 10 via the use of connecting member 276.

Figure 10:
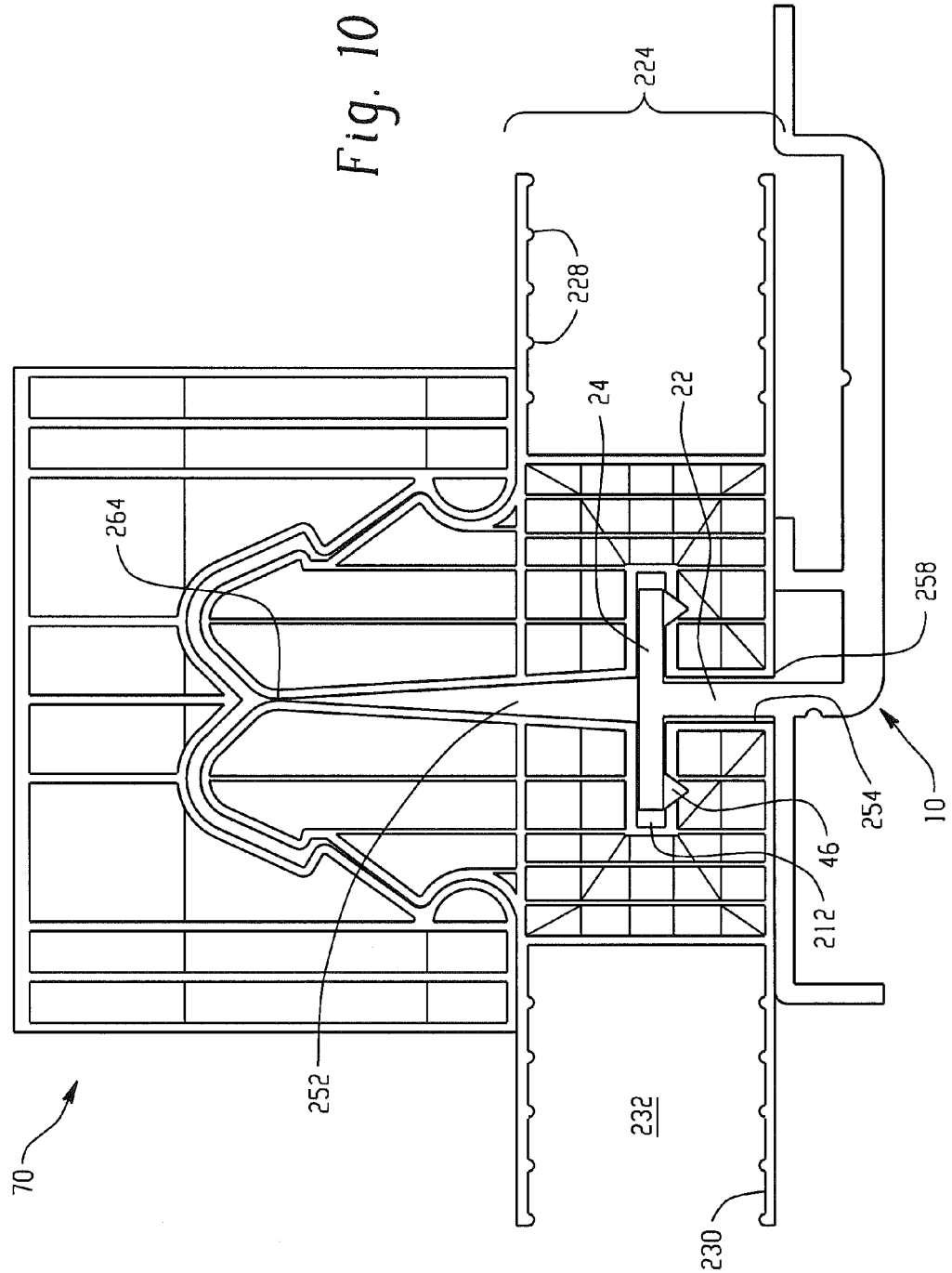
FIG. 10 is a front view of an assembled connector and side collectors with a thermal expansion clearance and with the clip of FIG. 6 having protrusions that attach to the panel.

Some further exemplary embodiments of additional connectors are set forth in FIGS. 10, 20, and 24. These embodiments further illustrate that the specific size and geometry of the connector is only limited by the size and geometry of the side collectors and clip to which it will be connected. Also, as is clear with respect to the panels and the side collectors, the connectors can optionally comprise various combinations of ribs 162 (e.g., horizontal, vertical, diagonal, and any combination thereof) as is desired, e.g., for additional structural integrity (e.g., see FIGS. 3 and 16). Any rib arrangement is based upon desired structural integrity for the particular connector, based upon where the connector will be employed and the loads it will experience.

The side collector(s) are located at the end of the panel, wherein adjacent side collectors (from adjacent panels) form the seam between the panels to be connected. As noted above, the side collectors can have various designs that are complementary to the design of the connector and clip so as to enable the collectors (male portion; connector engagement region 222 with a head 234) to mate with the connector (female portion; cavity 102) (or collectors (female portion) to mate with the connector (male portion)), e.g., see FIG. 23 and FIG. 24.

The specific geometry of the collectors is dependent upon the geometry of the connector to which they will be mated. Some exemplary geometries are illustrated in FIGS. 2, 9, 19, and 23. As can be seen in these figures, the collectors can optionally comprise rib(s) 226 (e.g., vertical, horizontal, and/ or diagonal to enhance the structural integrity of the collector. It is also noted that the density of the ribs (number of ribs per unit area), can be greater than the density of the ribs in the panel (if the collector is separate) or in the remainder of the panel (if the collector is integral). Diagonal ribs, for example, can be used along with vertical ribs and horizontal ribs in the area adjacent to the panel engagement region 224. In this embodiment vertical ribs and horizontal ribs are employed throughout the side collector, with diagonal ribs only located in the area adjacent to the panel engagement region 224 (e.g., no diagonal ribs are used in the connector engagement region).

As noted, the side collectors can be an integral part of the panel (e.g., see FIG. 2), or a separate component (e.g., see FIG. 19), e.g., a side collector formed separate from the panel and later attached to the panels (e.g., after manufacturing of the panel is complete). Non-integral side collectors, such as tongue and groove, base and cap, and standing seam side collectors are advantageous in that panel sizes (e.g., length, width, height, and/or thickness) are not limited by sizes that are already produced because of cost issues associated with creating, testing, and validating a new die system to produce the desired size. With non-integral side collectors, any size and combination of panels and/or sheets can be used, since the side collectors are produced separate from the sheet and attached at a later time (e.g., at or close to the job site). Additionally, different shape side collectors can be used to attach different panels of a system (e.g., roof) together. This enables the side collectors and connectors to be customized for the particular location and desired properties (e.g., to enhance structural integrity, sound dampening, and/or light transmission, etc.). Non-integral side collectors are additionally advantageous in that they essentially convert a standard panel (e.g., a planar panel with no side collector) into a modular panel. These side collectors can have a structure configured to wrap around an edge of a panel, (e.g., a U-shape) and be sized to receive the thickness(es) of the panel(s) to be fit therein. These side collector(s) can be welded (e.g., ultrasonically and/or thermally), chemically attached (e.g., chemically bonded or glued), and/or mechanically attached (e.g., screwed, bolted, riveted, etc.) and/or otherwise affixed to the panel(s).

As discussed above, the side collectors have a complementary design to the connectors so as to enable mating thereof. In many embodiments, these components can be snap-fit together. Hence, the side collector 210 comprises an area that enables the connector to readily move over the surface of the side collector, such that when a force is exerted on the connector toward the side collector, the sides 156 of the connector flex outward, away from the cavity 102 (see FIGS. 2-4). This enables the connector engagement region 222 to enter the cavity 102 until the flange 104 contacts the ledge 220, thereby allowing the sides 156 to move back toward the cavity 102.

Alternatively, in the various embodiments, if flexing of the sides 156 of the connector is not possible and/or not desirable, the connector can be disposed onto the collector by placing the side collectors of two panes adjacent to one another. The connector and collectors can be moved together (e.g., in the Z direction), sliding the connector and collectors together (e.g., sliding the connector engagement region 222 into the cavity 102).

Figure 8:
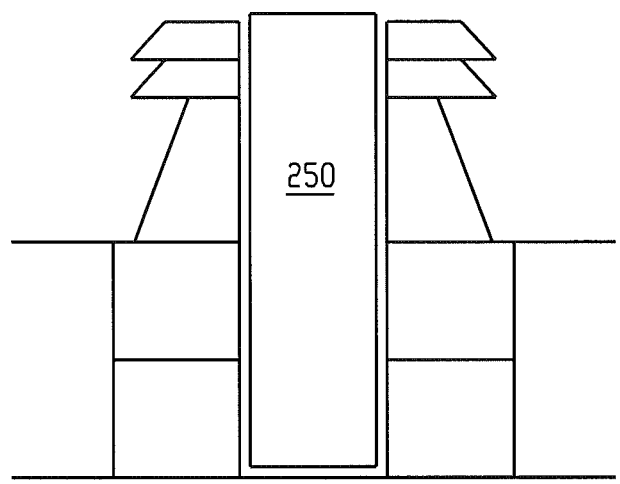
FIG. 8 is a front view of a standing seam side collector with a spacer between collector halves.
Figure 9:
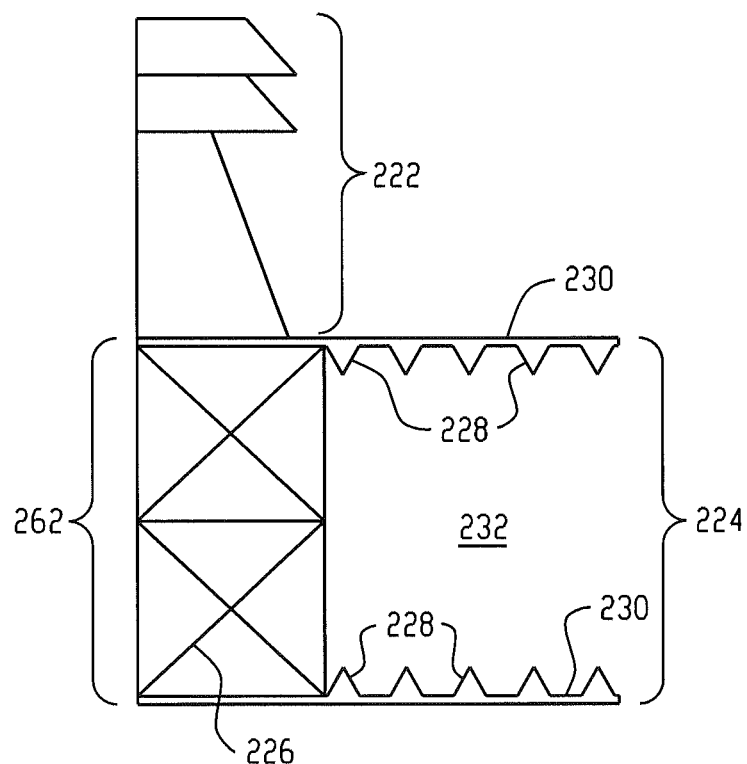
FIG. 9 is a side view of a standing seam side collector with extensions having energy directors for connecting a panel thereto.

When the collector is a separate element from the panel, it comprises a panel engagement region 224 (see FIGS. 9, 10, 19, and 23). The height of the panel engagement region 224 is sufficient to enable an end of a panel to be inserted therein (e.g., is sized to receive the thickness(es) of the panel(s) to be fit therein (see FIGS. 22 and 26)). Depending upon the design of the collector, the receiving area 232 can be defined by the connector engagement portion 222, collector arm(s) 230, and/or rib(s) 226. For example, in FIG. 19, the receiving area 232 is defined by the connector engagement portion 222 and arm 230. In FIG. 23, the panel engagement region 224 has an arm 230, but the receiving area 232 is defined by the connector engagement portion 222 and horizontal rib 226. In FIGS. 9 and 10, the receiving area 232 is defined by arms 230. In some designs, the arms 230 extend outward, e.g., from the connector engaging area (see FIGS. 8-10, 27, and 28), e.g., such that the panel engagement region comprises a body portion 262 which is located adjacent to the connector engaging region (see FIGS. 8 and 9) and arm(s) 230 extending from the body portion 262, forming receiving area 232 for attachment onto an edge of a panel. In other embodiments, the arms 230 are located in alignment with the connector engaging region (see FIGS. 19, and 23), e.g., such that the panel engagement region is located adjacent to the connector engaging region (e.g., the panel engagement region is formed by the arms 230 (which may be multiwalled), and no body portion).

Within the panel engagement region 224 can be energy director(s) 228 extending into the receiving area 232. The energy directors are small ridge molded into one of the mating surfaces. The energy director limits initial contact between the suffices to a very small area, and focuses the ultrasonic energy at the apex of the ridge (which is preferably a triangular shaped ridge (e.g., 90° or 60° triangular-shaped ridge). During the welding cycle, the concentrated ultrasonic energy causes the ridge to melt and the plastic to flow throughout the joint area, bonding the parts together. These energy directors can be configured to engage an outer surface (e.g., surface 208 of FIG. 12) of the panel to which the collector will be attached. The energy directors can aide in grasping and retaining the panel in the panel engagement region 224 of receiving area 232 and/or can redirect energy received by the collector and/or panel (e.g., during welding (e.g., ultrasonic welding, laser welding, and/or thermal welding) together of the collector and panel) into the ribs 198 of the panel (see e.g., FIG. 2). Therefore, desirably, some or all of the energy directors 228 are located in the receiving area 232 so as to align with vertical ribs (e.g., ribs extending in the Y direction) in the panel when the panel is inserted into the panel engagement region 224. The energy director(s) can be located on one or both horizontal surfaces (surfaces extending in the X direction) in the receiving area 232. To inhibit the arms from detaching from the panel, and/or to avoid moisture, air, and/or insect infiltration, an energy director can be located at the end of each arm 246 (e.g., FIG. 28). Furthermore, it was discovered that the strongest bond between an attachment member and a multiwall panel came about when an energy director was positioned directly over a vertical rib in a multiwall structure. Energy director(s) can be used on the vertical surface as in FIG. 19 when the panel has a closed end (e.g., is not open to the individual ribs), and has horizontal ribs or when the panel is a solid panel.

The number of energy director(s) employed can be different on each horizontal surface (and optionally the vertical surface), and can vary depending upon the length of the horizontal surfaces, the amount of vertical rib(s), if any, (and, if on the vertical surface, the amount of horizontal ribs) in the panel, and/or the amount of force that will be exerted onto the collector and/or panel when they are assembled together. For example, in the case of the multiwall panel, greater than or equal to 2 energy directors are generally employed on each horizontal surface, specifically, greater than or equal to 4, more specifically, greater than or equal to 5, and yet more specifically, greater than or equal to 8. Although any geometry can be employed for the energy director 228, a generally triangular geometry is employed, e.g., an isosceles triangle extending into receiving area (such as from the arm(s) 230). The height of the energy director (e.g., the distance the energy director extends from arm 230 into receiving area 232) can vary. Generally the height is less than or equal to 5 mm (millimeters), specifically, 0.25 mm to 2 mm, more specifically, 0.5 to 1 mm.

The energy directors can be formed as an integral part of the collector (i.e., an extension from arm 230, not an attachment to arm 230). Furthermore, to enhance compatibility between the collector and the panel, the energy director(s) can be formed from the same type of material as the panel, or can be a composition comprising the same type of material as the panel. For example if the panel is a polycarbonate panel, the energy director(s) can be polycarbonate, or a composition comprising polycarbonate, such as a polycarbonate and ABS.

Not to be limited by theory, it is believed that, e.g., during ultrasonic welding, the energy directors pinpoint the energy of the vibrating ultrasonic horn to a small area between the side collector and panel (apex of the triangle) causing the energy director to melt and subsequently fuse the side collector and panel together. Without the energy directors, the ultrasonic horn would vibrate, heat, and compress a large unmelted side collector into the panel, crushing a multiwall panel or creating a very weak bond with a solid panel. In addition or alternative to the welding, the side collectors 210 can also be attached to the panel by laser welding, by chemical, and/or mechanical methods (e.g., gluing, chemical bonding, fastener(s), and combinations comprising at least one of the foregoing).

Bonding a separate side collector to a panel can comprise inserting the edge of the panel into the receiving area of the side collector until the edge contacts the vertical wall and/or the panel cannot be inserted any further and creating relative motion between an ultrasonic welding horn and the arms of the side collector so as to melt the energy director(s) and form a bond between the arm and the panel surface.

To address thermal expansion of the panels, the side collectors can have a joint side with an angled wall (e.g., angled from the connector engagement region toward the receiving area) such that, when assembled, the joint walls 254 form a joint (e.g., space 252) having a decreasing width from the base 258 toward the point 264 (see FIG. 10). In other words, the joint wall can be non-perpendicular, as determined with respect to the arm 230. The joint walls form a space having a converging diameter from the base 258 toward the connector engagement region 222, and optionally all the way to the point 264 adjacent to the end of the joint wall 254 opposite the base 258. The size of the space formed by the adjacent walls should be sufficient to enable the thermal expansion of the panels to which the side collectors are attached. Essentially, as the panels thermally expand, they would exert a force on the side collectors, causing the side collectors to move toward each other. As the side collectors move toward one another, the width (as measured in the X direction), of the space decreases. The space can have a width (as measured in the X direction, and in the relaxed state (i.e., when no force is applied due to thermally expanding panels)), at the base 258, of greater than or equal to 1 mm, specifically, 2 mm to 10 mm, and more specifically, 2.5 mm to 5 mm.

Alternatively, or in addition to the joint 252, a spacer 250 can be located between adjacent joint walls 254. The spacer can comprise a flexible material that can be compressed by expanding panels, e.g., a foam or elastomeric material (see FIG. 8). The spacer can have a sufficient size and compressibility to allow for the thermal expansion of the panels. For example, the spacer can have a thickness (measured in the X direction and in the non-compressed state) of greater than or equal to 1 mm, specifically, 2 mm to 10 mm, and more specifically, 4 mm to 8 mm.

When the side collector is to be used with an alignment clip that will not engage the outer surface of the side collector and/or the connector, the side collector has an opening 212 to receive the cross-member 24 of the clip 10 (e.g., see FIGS. 2 and 10). This opening is located in the joint wall 254 adjacent the receiving area 232.

As is mentioned, a clip can be employed with the connector and collectors. Different types of clips are possible. For example, the clip can be an alignment clip (e.g., see FIG. 1), and/or a combination alignment clip and engagement clip (e.g., FIGS. 17, 21, and 25). Hence, the clip can comprise an alignment region that is designed to align the adjacent panels such that when the panels are attached together, they are level. For example, in FIG. 1, the clip 10 is illustrated as comprising a cross-member 24 at one end of stem 22 and a base 18 at the other end. The base 18 can have a foot 28, side(s) 12, 14, leg(s) 16, area 20, and/or support(s) 26, e.g., the base can form a "u" shape (e.g., with a side 14, leg 16, and arm 30 (see FIGS. 2 and 21), or with legs 16 and foot 28 (see FIG. 25)). For example, as is illustrated in FIGS. 1, 4, and 21, the base can comprise sides 12, 14 (extending in the Y directing away from the engagement) defining area 20, with arm 30 extending from the side 14 to leg 16 (which extends in the Y direction toward the engagement). The foot 28 can extend away from stem 22 in one or both directions, e.g., forming a L-shaped foot or a T-shape (see FIGS. 1, 17, 21, and 25), with the stem, respectively. The T-shaped stem allows even alignment of the assembled panels since both of the adjacent panels are held the same distance from the support. However, the L-shaped foot only extends along one panel and hence does not support the panels evenly when assembled (e.g., the panels will be offset by the thickness of the foot 28).

Building codes often require panel and connector assemblies be able to withstand wind loads of 80 mph to 280 mph (130 kph to 450 kph) without failing, i.e., without being pulled off. Such wind loads can create a "negative wind load" that can pull a roof or wall from its supports with forces of 16 pounds per square foot (lb/ft$^2$) to 200 lb/ft$^2$ (about 766 Pascals (Pa) to about 9576 Pa). A potential failure mode can be observed in connector assemblies exposed to such wind loads in that the panels can separate from one another at the attachment point due to deflection and subsequent release of the clip from the attachment point. The clip 10 in FIG. 1 can be modified to incorporate features that can help prevent the separation of adjoining panels and thus, prevent subsequent release from the attachment point and failure of the connector and panel assembly.

Figure 6:
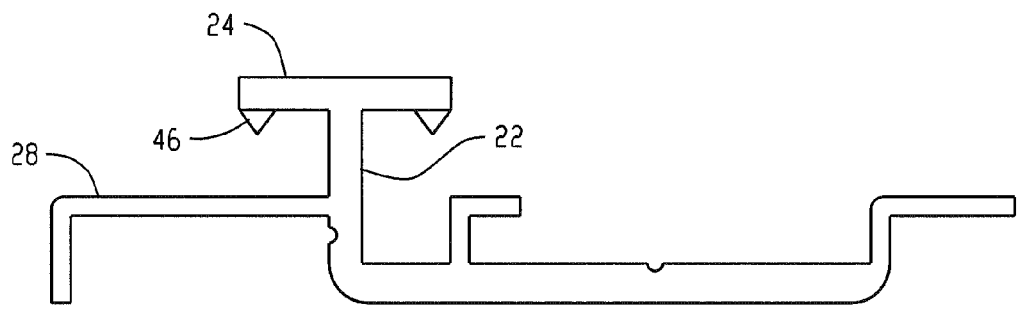
FIG. 6 is a front view of another embodiment of a clip for use in assembling a structure.
Figure 7:
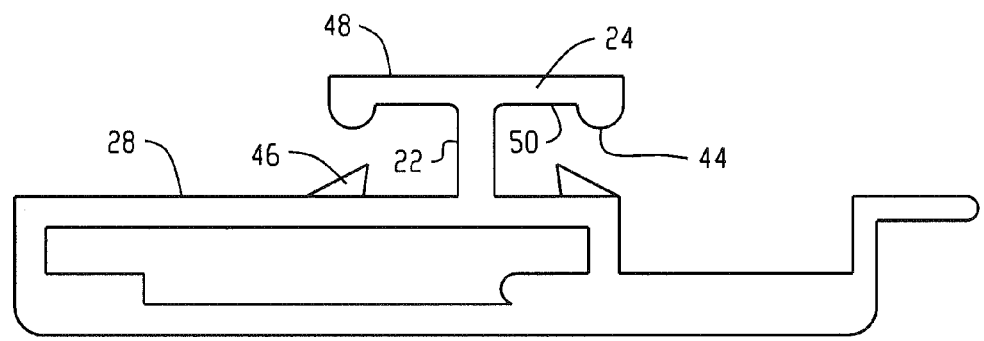
FIG. 7 is a front view of a design of a clip for use in assembling a structure.
Figure 11:
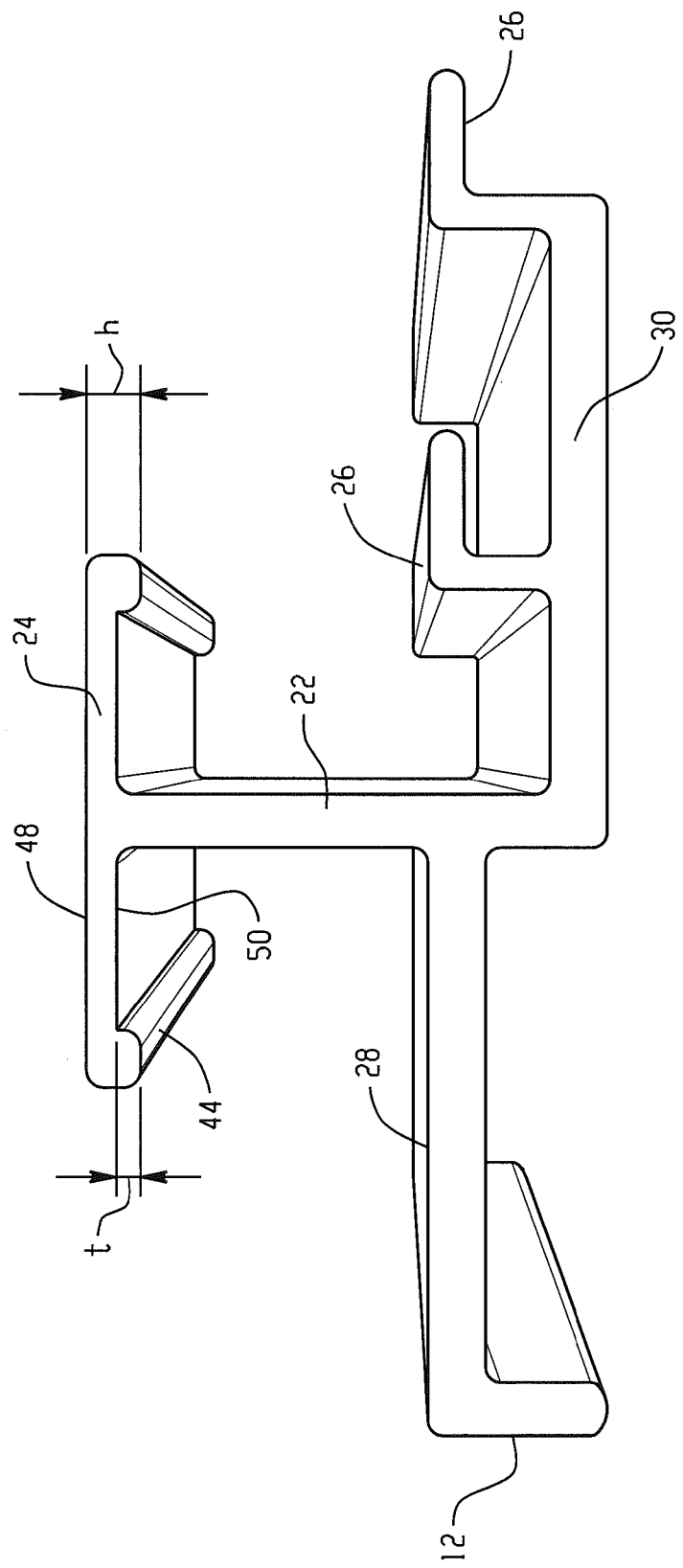
FIG. 11 is an isometric view of a clip having a lip to hold an assembly together when exposed to a load.
Figure 12:
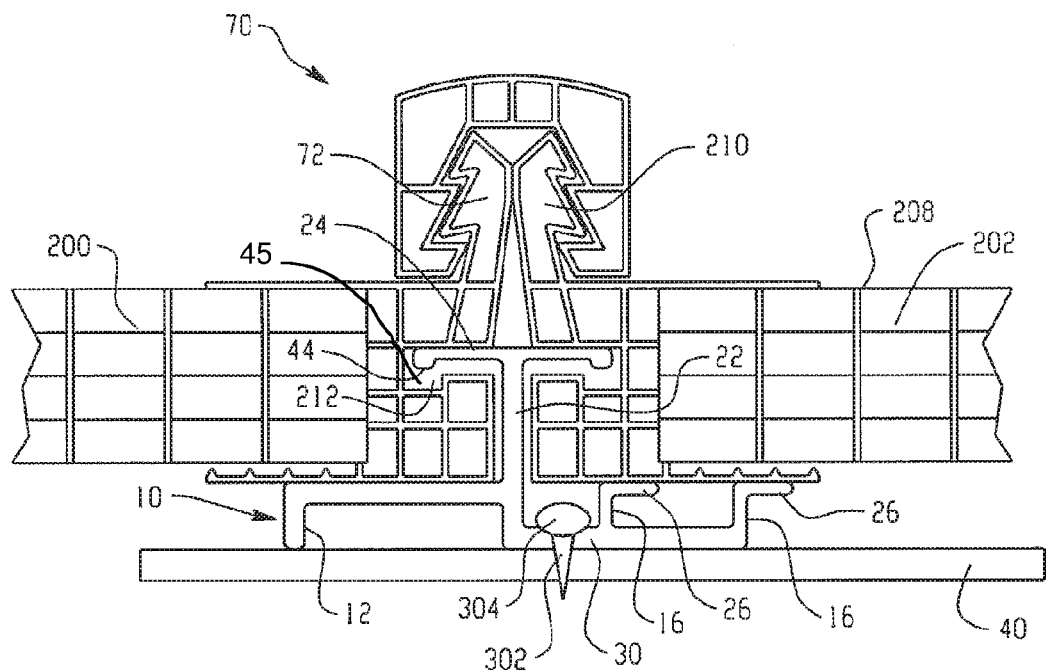
FIG. 12 is a side view of an assembled connector and standing seam side collector with extensions having energy directors and panels to be connected thereto and a clip having the design of FIG. 11.

For example, referring now to FIG. 5, which is a cross-sectional view of the cross-member 24 and stem 22 of clip 10, the various design features (e.g., lip(s), extension(s)) to aid in preventing disassembly during wind loading are illustrated. FIGS. 6 and 7 also illustrate various designs of clip 10 incorporating the design features described herein. For example, as illustrated in FIG. 5, the cross-member 24 can comprise extensions 44, 46 that are configured to engage with the opening 212 in side collector 210 to assist prevention of separation of the panels, e.g., to prevent separation of panels 200, 202 as illustrated in FIG. 4 when facing a wind load (e.g., a negative wind load). Cross-member 24 can, itself, be designed so that the extension is a lip 44 on either or both sides of the cross-member 24 (e.g., first side 48 and/or second side 50). As illustrated in FIG. 5, the lip 44 can protrude upward and/or downward from either side 48 and 50 of cross-member 24. One embodiment of a clip 10 comprising a lip 44 protruding downward from cross-member 24 is illustrated in FIG. 7; another possible design is illustrated in FIG. 11. In embodiments where lip 44 is present, the opening 212 in side collector 210 can, optionally, be modified as shown in FIG. 12, i.e., opening 212 can be modified to accommodate (i.e., compliment or match) the lip 44. In FIG. 11, another embodiment of clip 10 is illustrated having a lip extending from the second side of the cross-member 24 to engage with an opening 212 in a side collector 210.

Cross-member 24 can also, alternatively, or in addition to lip 44 have protrusion 46 protruding therefrom on either or both sides 48, 50 upward or downward as illustrated in FIG. 5. FIG. 6 illustrates a clip 10 with protrusion 46 extending downward from cross-member 24. Protrusion 46 can be configured to penetrate into the side collector 210 in the area of the opening 212, creating a gripping effect and being able to prevent disassembly of the connector assembly 70. For example, the protrusion 46 can comprise spike(s) or other triangular or pointed element(s). FIG. 7 illustrates an embodiment where a clip can also, optionally, comprise protrusion 46 extending from the foot 28 of the clip 10 with a lip extending from the second side 50 of the cross-member 24 so that lip 44 and protrusion 46 face one another. For example, as illustrated in FIG. 7, the protrusion 46 can be pointed inward for ease of assembly and to make disassembly more difficult. It is contemplated, however, that the protrusion 46 can be oriented in any direction that will provide the desired panel retention when a force is applied. It is to be understood that any combination of lip 44 and/or protrusion 46 can be included in any of the embodiments disclosed herein.

Figure 13:
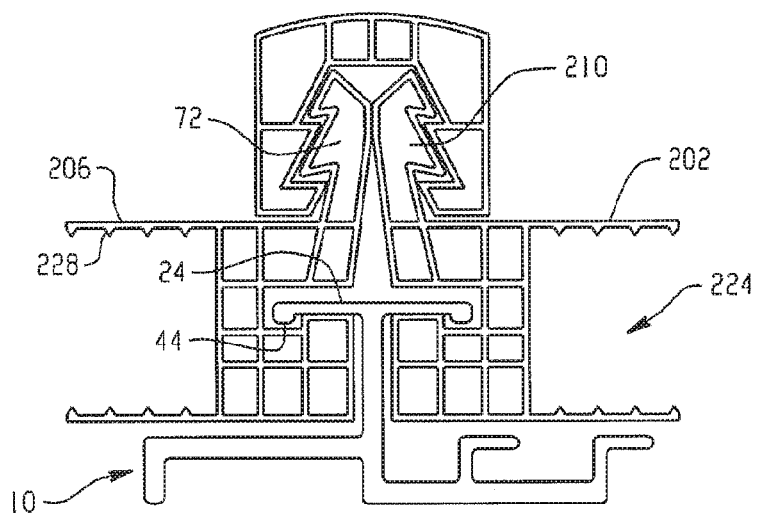
FIG. 13 shows the assembly of FIG. 12 when a negative load is applied.

FIG. 12 illustrates a connector assembly 70 with a cross-member 24 having lip 44 that is not under a load, while FIG. 13 illustrates the same, but under a negative wind load. In FIG. 12, arm 30 can be used to attach the clip 10, and hence, panels 200, 202 to a support structure 40 using a fastener 302 having a fastener head 304. Exemplary fasteners include a bolt, screw, nail, rivet, nut, peg, glue, two-sided tape, as well as combinations comprising at least one of the foregoing. Exemplary supports include a beam (e.g., purlin, I-beam, rectangular beam, etc.), piling, wall, a rafter, post, header, pillar, roof truss, as well as combinations comprising at least one of the foregoing. As illustrated in FIG. 12, the clip can comprise multiple legs 16 and supports 26 that can provide design flexibility while providing solutions for various applicable building codes and can also support panels 200, 202 and can maintain level spacing between panels 200, 202.

As can be seen in FIG. 13, when under a negative wind load, there can be uplift in the Y direction (see coordinate system illustrated in FIG. 18) of the connector assembly 70, but the lip 44 is able to engage with opening 212 in the side collector 210 to prevent side collectors 210 and thus, panels 200 and 202 from separating from one another. (e.g., resist X direction separation). For example, when the panel 200, 202 experiences a negative wind load, the panel 200, 202 can be pulled so that only the clip 10 holds the panel to the structure. The lip 44 effectively creates a mechanical to stop preventing the panels from detaching. FIG. 13 additionally illustrates that the panel engagement region 224 can, optionally, comprise energy directors 228 as described in more detail with respect to FIG. 28.

If the opening 212 of the side collector 210 is not modified to match with the lip 44 of the clip 10, the lip 44 can still function to hold the side collectors 210 and panels 200,202 together due to increased concentrated pressure of the lip 44. The material of the side collector 210 will yield to the lip 44 and the lip 44 can penetrate into the side collector 210 in the area of the opening 212, creating a gripping effect (e.g., mechanical stop) to assist the connector assembly 70 from disassembling when under load.

Insertion of the clip 10 with the lip 44 can be accomplished by ensuring the thickness (h) of the clip 10 is less than opening 212 in the side collector 210 (see e.g., FIGS. 11 and 12). It is contemplated that the clip 10 can be slid in from either or both ends of the panels which are to be interconnected, which would allow for a constricted or even force fit between the thickness (h) of the clip and the opening 212 in the side collector 210. Additionally, it is contemplated that the clip 10 could be forced into the opening 212 from the side of the panel if the thickness of the clip 10 was larger than the opening 212.

Figure 37:
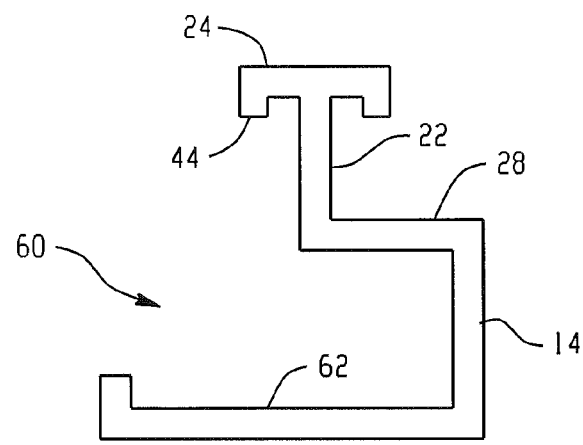
FIG. 37 is a front view of a clip having a lip to hold an assembly together when exposed to a load.

As illustrated in FIGS. 12 and 13, the tolerance between the thickness and height of the opening 212 in the collector 72 and the thickness (h) and height (t) of the lip 44 (see e.g., FIG. 11) can create a floating effect in the connector assembly 70 that can provide allowances for thermal expansion as well as the ability to slide the panels along the clip after assembly. Alternatively, or in addition to, a zero tolerance situation can occur in which the ability to slide the panel is restricted and the clips can be slid onto the panel from an end of the panel and moved into place before securing from a side or bottom of the clip. In either case, the lip 44 can extend into the notch 45. FIG. 37 illustrates a clip 60 that can be used in this embodiment where the clip comprises a cross-member 24 having a lip 44 with a foot 28 connected to a side 14 with a landing 62 extending therefrom.

Turning again now to FIG. 12, when the clip 10 is assembled onto panels 200, 202, arm 30 on the clip 10 can be used to attach the clip 10 and thus, panels 200, 202 to a support structure 40 using fastener 302. Exemplary fasteners include a bolt, screw, nail, rivet, nut, peg, glue, two-sided tape, as well as combinations comprising at least one of the foregoing. Exemplary supports include a beam (e.g., purlin, I-beam, rectangular beam, etc.), piling, wall, a rafter, post, header, pillar, roof truss, as well as combinations comprising at least one of the foregoing.

Figure 14:
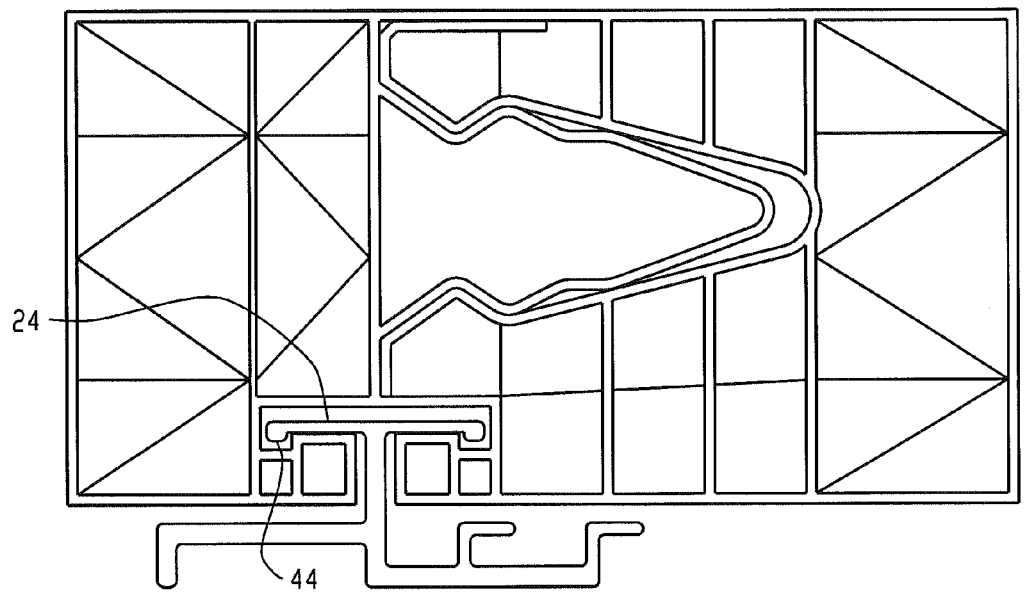
FIG. 14 is a cross-sectional view of a panel having allowance for the clip design of FIG. 11.
Figure 15:
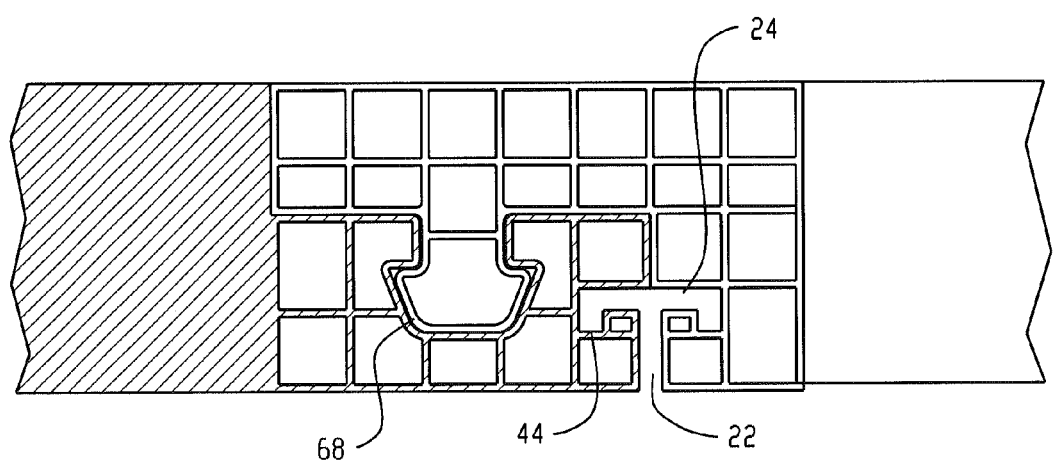
FIG. 15 is a cross-sectional view of a lap joint connection system with a mating area for receiving the clip having the design of FIG. 11.

FIG. 14 is an embodiment of a panel (e.g., LEXAN™ THERMOCLICK) panel where the panel is modified to accommodate a clip 10 having the design illustrated in FIG. 11. Similarly, FIG. 15 is an embodiment where a clip 10 having the design illustrated in FIG. 11 is connected to panels having a lap joint connection 68.

When the clip 10 is assembled onto adjacent panels 200, 202 (see FIG. 4), side 12 is adjacent the first panel 200, while side 14 is adjacent the second panel 202. Arm 30 (FIG. 1) can be used to attach the clip 10, and hence the panels 200, 202, to a support 300 using fastener(s) 302. Similarly, when an arm 30 is not present, fastener(s) 302 can be attached to the support 300 through the foot 28 (see FIG. 17). Exemplary fasteners include a bolt, screw, nail, rivet, nut, peg, glue, two-sided tape, as well as combinations comprising at least one of the foregoing. Exemplary supports include a beam (e.g., purlin, I-beam, rectangular beam, etc.), piling, wall, a rafter, post, header, pillar, roof truss, as well as combinations comprising at least one of the foregoing.

In order to prevent the panels 200, 202 from being unlevel due to the presence of the fastener 302, the side(s) 12, 14, and/or leg(s) 16 have a length "l", and/or the solid area 20 has a thickness, that is greater than or equal to the height "h" that the fastener head 304 extends from the linear portion 22 (e.g., stem 22) toward the panels. If there is a difference in the thickness of the panels (in the Y direction), the side(s) 12, 14, and/or leg(s) 16 have a length "l", and/or the solid area 20 has a thickness (as is appropriate), to compensate for the difference in the panels' thicknesses, such that, when the panels, connector, and clip are assembled together, the outer surface 208 of the panels are level with one another; they are aligned. In other words, the side(s) 12, 14, and/or leg(s) 16 have different length "l", and/or the solid area 20 has a different thickness, wherein the difference in the length/thickness is equal to the difference in the panels' thicknesses.

Further structural integrity can be attained in the clip via the use of an optional extension from the leg(s) 16 and/or sides 12, 14, e.g., support 26. Lateral extension(s) (e.g., support) 26 (e.g., see FIGS. 1, 11, 17, 21, and 25) can be employed with the various embodiments of the clip, wherein the lateral extension(s) can extend toward and/or away from the adjacent panel to which the clip is connected. For example, the lateral extension(s) can extend toward and/or away from the stem 22 (in the X direction). These extension(s) can provide support to the panel as well as inhibit air, water, and/or insect infiltration.

At the end of the stem 22 opposite the foot 28 is an engagement that can be located in an opening in the side collector and/or can contact a surface of the side collector. Exemplary engagements include a cross-member 24 (see FIGS. 1 and 21), receiver(s) 52 (see FIG. 17), and/or support structure 40 (see FIG. 12). In various embodiments, the engagement can have a generally T-shape (e.g., the cross-member 24 is located perpendicular to the stem 22), and/or can be arcuate (e.g., extending from the stem 22 in a manner complementary to the shape of the side collector slide region 214 (e.g., FIG. 17 receiver 52 in combination with FIG. 16). Stated another way, a receiver(s) 52 can diverge from the stem 22 at an end opposite the base 18. Hence, the engagement can be configured to be located in an opening in the side collector (see FIGS. 2 and 4, opening 212 in side collector 210), or can, when assembled, be located between the side collector (e.g., the slide region 214) and the connector (e.g., the inner surface 122 (see e.g., FIG. 3) (see also FIG. 26, receiver(s) 52 contacting surface (slide region) 214). When the engagement is configured to be located in the opening 212, the stem has a length that is less than the height of the receiving area (e.g., both measured in the Y direction). In other words, the stem has a length that is less than the thickness of the panel that will be received in the receiving area 232 (see e.g., FIG. 10).

As illustrated in FIGS. 21 and 22, cross-member 24 can comprise an extension (e.g., protrusion 46) on the second side 50 of the cross-member 24 which will engage with the panels 200, 202 of FIG. 22 to assist in preventing panel separation when a load is applied to the assembly. FIGS. 25 and 26 illustrate yet another embodiment where extensions can be present on cross-member 24 (e.g., on the first side 48 and/or on the second side 50). For example, as illustrated in FIGS. 25 and 26, protrusion 46 can be located on cross-member 24. It is contemplated, however, that lip 44 could also be present on cross-member 24, as well as any combination of lip 44 and protrusion 46.

The cross-member 24 can extend out from the stem 22 in the "X" plane (e.g., see FIGS. 1, 11, 21, and 25), in one or both directions (e.g., positive and negative) and the distance in each direction can be the same or different. Similarly, one or more wings can extend from the stem 22 along the "X" plane, in one or both directions, with the length of the wings being the same or different (see FIG. 17). Larger wing widths can provide higher wind loads. The desired width of the wings (e.g., from the end of one wing to the end of the other wing), is therefore dependent upon the intended application and desired structural integrity. Wing spans of up to and exceeding 50 mm can be employed, specifically spans of 5 mm to 40 mm, and more specifically spans of 10 mm to 30 mm.

With respect to the angle at which the cross member 24 and lip 44 extend from the stem 22, it is also determined based upon desired structural integrity and the desired shape of the side collector to which the clip will connect. The cross-members can extend from the stem at an angle θ of 85° to 95°, with an angle of 90° desirable to enable higher loadings. An angle θ of more than 90° reduces load potential while an angle θ of less than 90 inhibits assembly of the panels and the clip. The wings are generally curved and extend from the stem 22 at an angle θ of 100° to 155°, specifically, 35° to 75°, and more specifically, 40° to 50°. For example, clips having an angle θ of 90° have a loading capacity of 100 lb/ft$^2$ (4,788 Pa), while at an angle of 135°, the clip (comprising the same material and thickness), has a loading capacity of less than 80 lb/ft$^2$ (3,830 Pa).

The length of the clip (i.e., in the Z direction, see coordinate system illustrated in FIG. 18) is also dependent upon desired structural integrity (e.g., wind load resistance). When maximum wind load resistance is desired, the clip length is equal to the length of the panel. When less resistance is needed, the clip can have a length that is less than or equal to 50% of the length of the panel, specifically less than or equal to 25% of the length of the panel, and more specifically, less than or equal to 10% of the length of the panel. For example, the clip length can be less than or equal to 24 inches (61 centimeters (cm)), specifically, less than or equal to 12 inches (30.5 cm), more specifically, less than or equal to 6 inches (15.2 cm), yet more specifically, less than or equal to 3 inches (7.6 cm), and even less than or equal to 2 inches (5.1 cm).

In addition to the cross-member(s) 24 and/or receiver(s) 52, the engagement can further comprise member(s) 38. The member(s) 38 are configured to receive a portion of the connector and/or fastener(s) (e.g., to receive protrusion 120 into region 42 defined by member(s) 38; see FIGS. 20 and 21; and/or to receive fastener 302 (see FIG. 12)). Therefore, the member(s) 38 can optionally be threaded, and/or comprise an adhesive or bonding agent, e.g., to facilitate retention between the clip and the connector. In addition to the member, support structure 40 may extend outward from the member and to the wing to provide additional structural integrity to the member (see FIG. 17). The geometry of the support structure is preferably complementary (e.g., the negative) of the geometry of the portion of the connector and/or collector to which it will be adjacent when assembled.

The stem 22 extends from a base 18 (e.g., from the foot 28) to the engagement. Therefore, if the engagement is configured to be located in the opening 212, the stem 22 will have a length that is less than the thickness of the panel, while if the engagement is configured to physically contact the surface of the side collector, the stem 22 will have a length that is greater than or equal to the thickness of the panel (measured in the Y plane).

Figure 27:
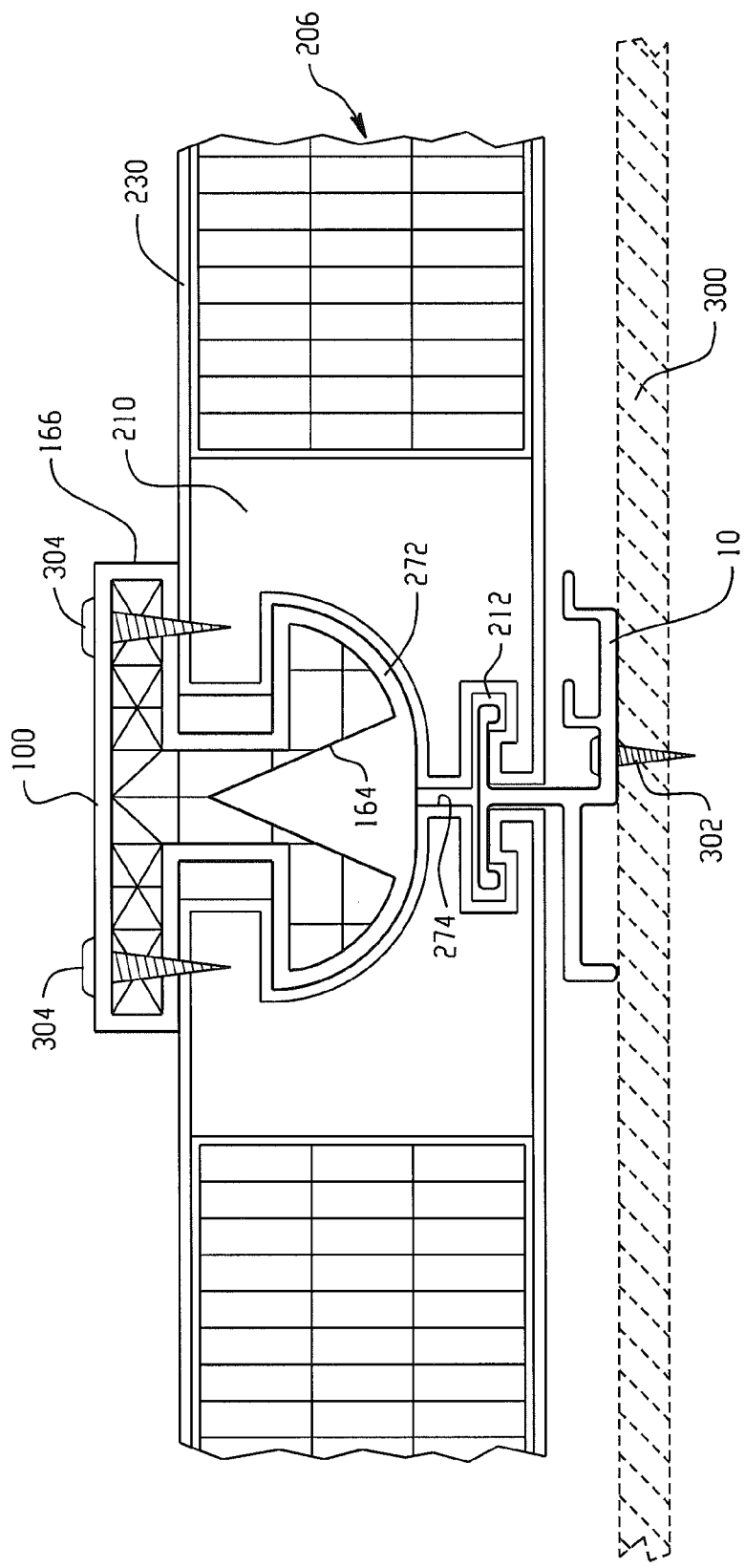
FIG. 27 is a side view of an embodiment wherein the connector is the male component and the side collector is the female component of an exemplary connector assembly.

Referring to FIG. 27, this figure is intended to show that the above configurations can be reversed such that the connector is the male element and the side collectors form the female element to enable mating of these components. In this exemplary embodiment, when the side collectors are assembled together, the joint walls 274 form the cavity 272. As with the other embodiments, any complementary mating engagement can be employed, such as snap-fit, tongue-and-groove, etc. The connector can further be attached to one or both of the side collectors with a clip 10 and fastener 302. As can be seen from the figure, this arrangement enables a small profile since there is a minimum amount of connector and no side collector, extending away from the panels. The distance that the support 166 of the side collector extends away from the side collector 210 is dependent upon the size of the panels and the clips. For example, the support 166 can have a thickness (measured in the Y direction), that is less than or equal to 30% of the thickness of the panel 206 (measured in the Y direction), specifically, less than or equal to 20%, and even less than or equal to 10%. In some embodiments, the support has a thickness of less than or equal to 40 mm, specifically, less than or equal to 30 mm, and more specifically, less than or equal to 20 mm, and even less than or equal to 10 mm.

Figure 28:
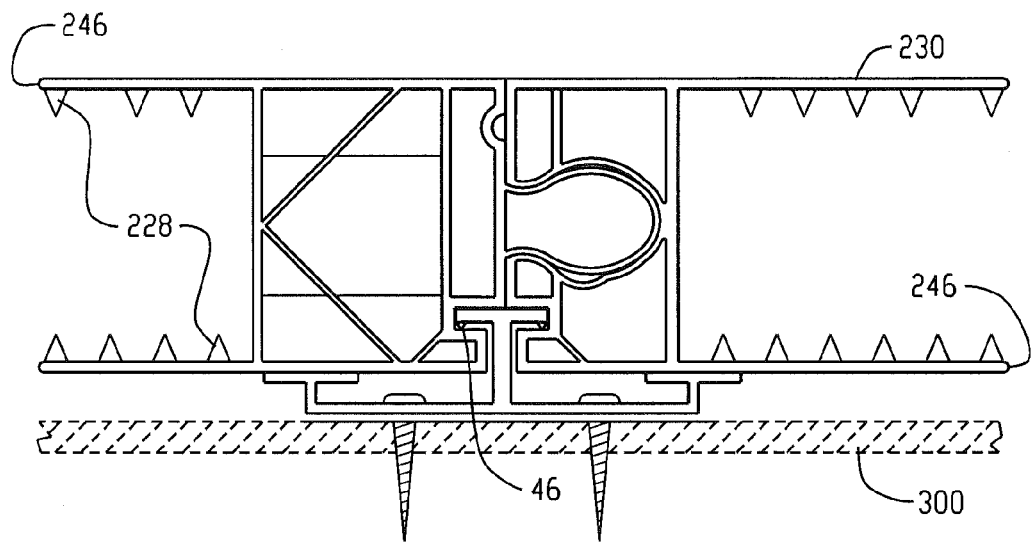
FIG. 28 is a side view of an exemplary embodiment of a side collector configured to mate with another side collector, e.g., tongue and groove, without the use of a connector.

Referring to FIG. 28, exemplary embodiments illustrating connector assemblies that use the side collectors to hold the panels together without the need for connectors. In these embodiments, mating pairs of side collectors have complementary geometries (e.g., tongue-and-groove (FIG. 28)). In these embodiments, the side collectors do not have mirror geometries with each other (e.g., as is illustrated in many of the other figures. They have complimentary, mating geometries that enable the two side collectors to fixedly mate (e.g., to hold together so as separate only when intentionally disassembled). In many embodiments of these side collectors, and even of the above connector/side collector groups, the elements permanently mate (e.g., once the elements are assembled they cannot be disassembled without breaking one or more of the components).

The connector, side collector, and clip can, independent of the other elements, comprise any material that gives the desired properties (e.g., light transmission, insulation, strength, durability, and/or impact resistance, etc.). For example, they can each independently comprise a metal (e.g., aluminum), a polymeric material (e.g., acrylic, polycarbonate, etc.), or combinations comprising at least one of the foregoing. For example, the clip can comprise aluminum (e.g., 6000 series aluminum such as aluminum 6061; 7000 series aluminum such as aluminum 7108 or aluminum 7055; stainless; and other metals that will allow the clip to provide the desired wind load protection to the connector assembly as well as combinations comprising at least one of the foregoing. Panels, side collectors, and/or connectors can optionally, independently, be solid or hollow (e.g., multiwall, for example comprising support structures, such as ribs). If the ribs are present, the density and configuration (straight, angled, parallel, perpendicular, etc.) of the ribs, is merely dependent upon the desired structural integrity and transmissivity of the particular element. For the side collectors and connectors, the ribs can have a thickness of up to 1 mm, specifically, 0.25 to 0.75 mm, and more specifically, 0.35 to 0.6 mm. In some embodiments, the diagonal ribs have a greater thickness than the parallel and/or perpendicular ribs (wherein parallel and perpendicular are determined in relation to the X direction). Diagonal ribs are ribs that are neither parallel nor perpendicular. In other words diagonal ribs not parallel or perpendicular to the panel outer surface when the element (collector or connector) is attached to the panel. Diagonal ribs provide improved stiffness in all directions compared to vertical and horizontal ribs. Ribs, particularly diagonal ribs, can be used to tune the degree of stiffness (e.g., flexibility of the elements). Desirably, the connector engagement region of the side collector is stiff (rigid such that it does not flex or bend when being assembled with the connector), while the connector has flexible sides 156 (e.g., FIG. 16) to enable it to be assembled over the side collector.

If multiwall panels are used, any number of layers or sheets can be used, with any combination of support structures being contemplated for use. Owing to the connector assemblies (e.g., to the separate side collectors), one can choose a panel having any desired thickness, structure (multiwall or solid), color, width/length, and shape, and adapt its edges to bear edge connectors having the desired attachment structure, and affix it to other panels having edge connectors with complementary attachment structure. Standard panel thicknesses are 4, 4.5, 6, 8, 10, 16, 20, 25, 32, 35, 40, 45, and 50 mm, and further, different varieties of multiwall panels are available, generally having 2 to 10 layers, specifically, 2 to 6 layers (e.g., with 1 to 5 cells across the panel thickness). Also, the cavities can have a variety of internal structures (rectangular passages, triangular passages, etc.). For example, the panels can be solid, hollow, or a combination thereof (e.g., can be multiwall panels wherein cavities of the panels are hollow and may optionally be filled, e.g., comprise a gas, a fluid, and/or a solid, depending on the desired properties of the structure (e.g., soundproof, heat transmission, light transmission, weight, etc.).

Figure 36:
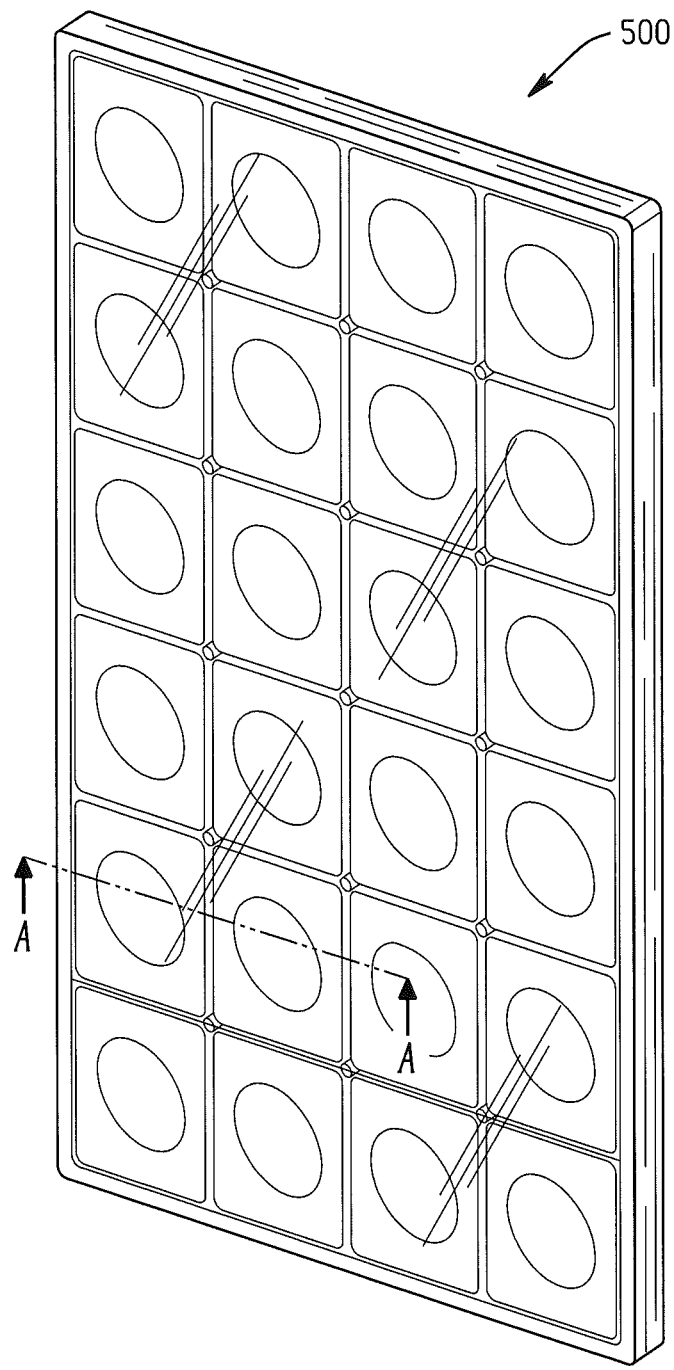
FIG. 36 is an assembled view of a photovoltaic module.
Figure 39:
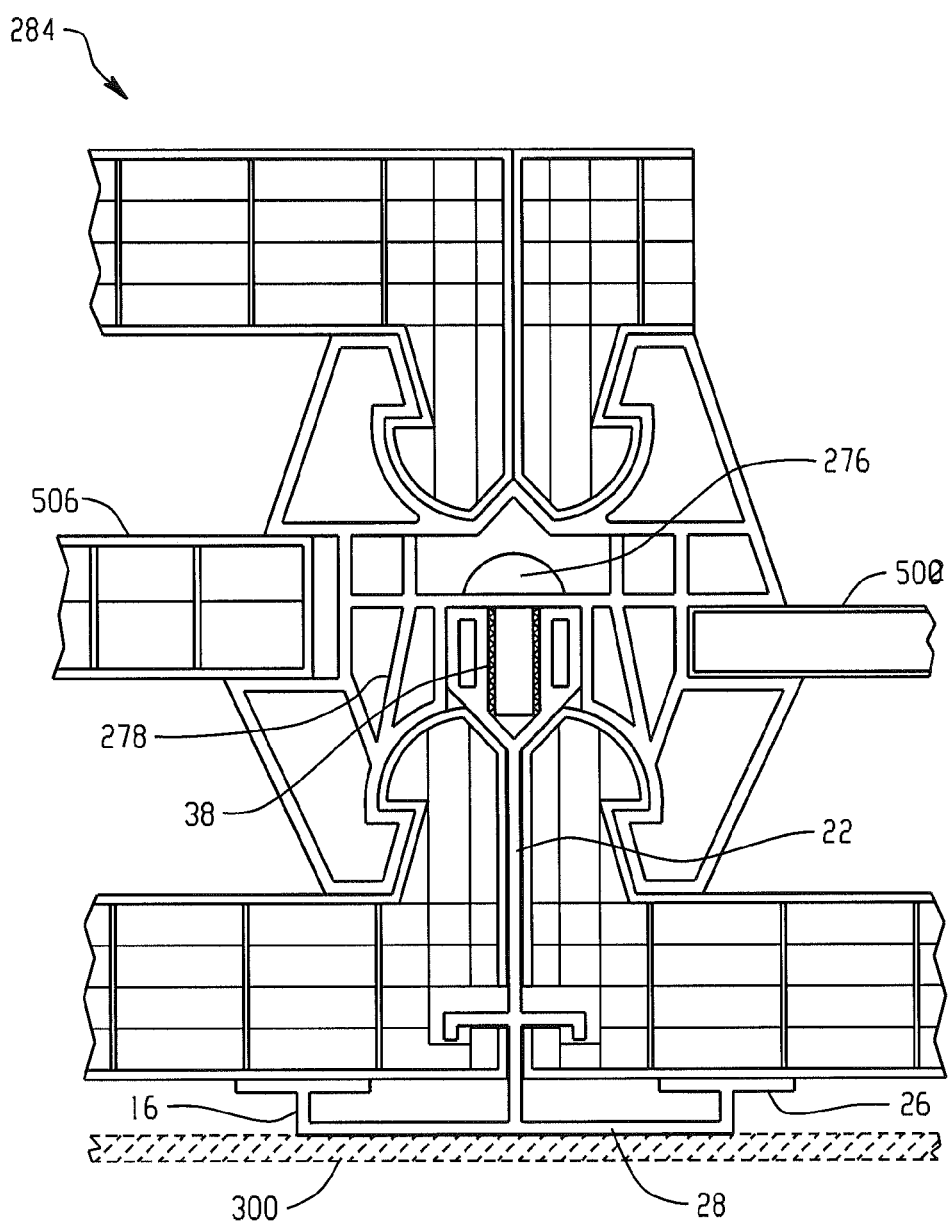
FIG. 39 is a front view of FIGS. 16 and 17 assembled and connected to a photovoltaic panel.
Figure 40:
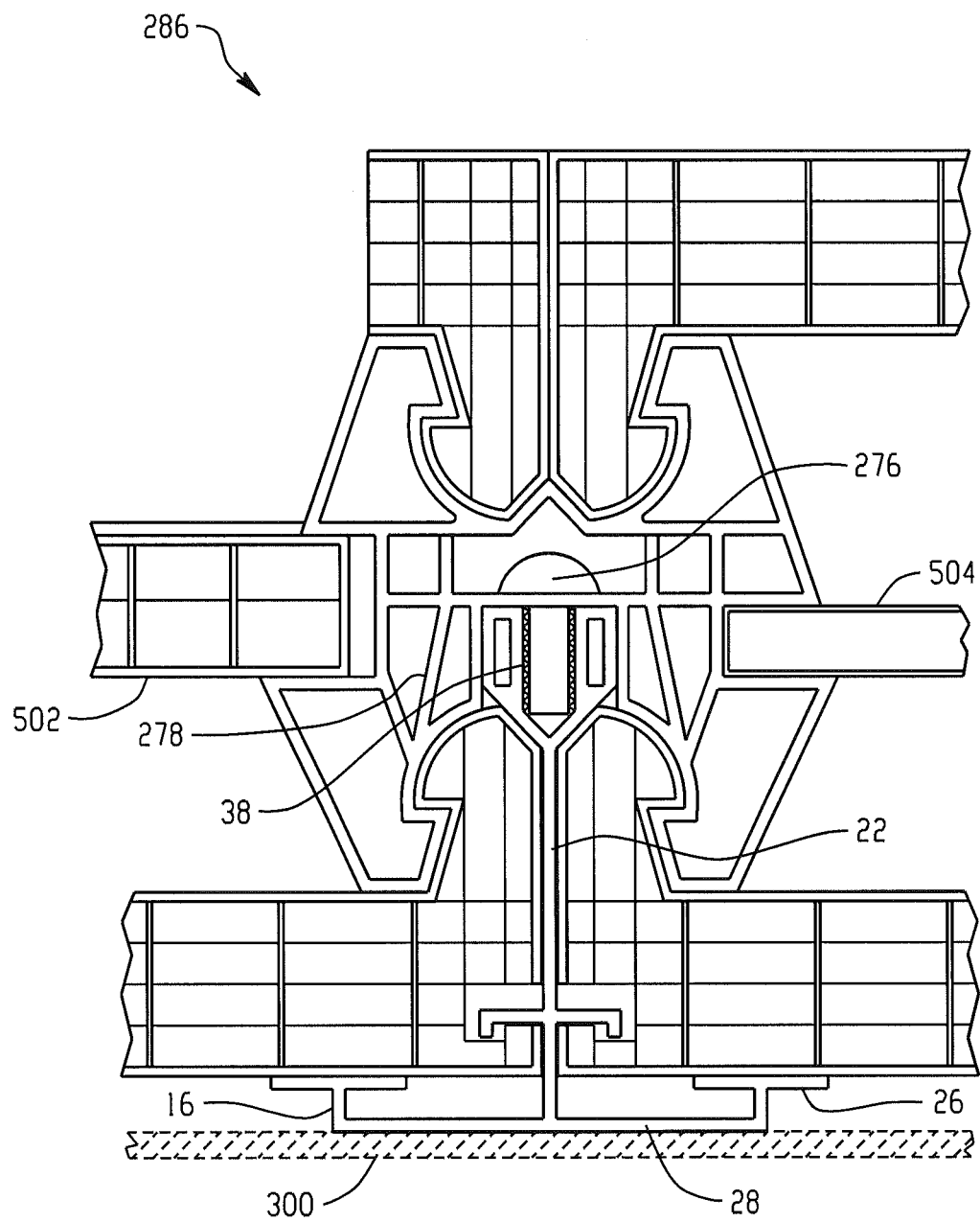
FIG. 40 is a front view of FIGS. 16 and 17 assembled and connected to a photovoltaic panel.

Furthermore, conceivably, due to the flexibility attained with the side collectors, radically different panels (e.g., a 4 mm solid panel and a 32 mm multiwall panel) can be fit together, so long as the panels were each fit with side collectors having complementary attachment structures. For example, the panel can be a functional panel such as a photovoltaic panel designed to be a portion of the structure with the structural integrity of solid, hollow, or filled panels. For example, the panels can optionally be arranged so that there is a space between adjacent stacked panels (e.g., see FIG. 18) or without space between the adjacent stacked panels and the panels can be solid, hollow (which, for example, could be useful for cooling functional panels generating and/or absorbing heat), and/or filled (with a fluid such as a liquid, gel, and/or gas), with a variety of rib configurations (e.g., see FIG. 18). Other functional panels can include, but are not limited to skylight inserts, infrared absorbing, and/or reflecting structures, solar water heaters, electrical roof fans, plastic fan blades driven by heat convection, etc. For example, as illustrated in FIGS. 39 and 40, a double sided connector and clip can be assembled with a photovoltaic panel 502 in slot 150, 152 (see FIG. 16). FIG. 36 illustrates an example of a photovoltaic module 500. The double side connector and clip are the same as previously discussed with respect to FIGS. 16 to 18. FIG. 40 illustrates an embodiment where a flexible photovoltaic module is be bonded to a multiwall sheet or to a standing seam forming photovoltaic panel 502 and inserted into slot 150, while another panel 504 can, optionally, be inserted into slot 152, while FIG. 39 illustrates an embodiment where a photovoltaic panel 502 can be directed inserted into slot 152 or where the photovoltaic panel 502 can, optionally, be bonded to a solid or multiwall sheet and inserted into slot 152 and another panel 506 can, optionally, be inserted into slot 150.

When the panel will comprise a photovoltaic (PV) module, the panel can be a monolithic element (e.g., see FIG. 45) or can be a multiwalled panel, and the module can be attached thereto. The module can comprise a cover sheet, a back sheet, with a solar cell array therebetween. The solar cell array can be attached to the cover sheet and/or the backing sheet with an encapsulant. Additionally, depending upon the composition of the cover sheet and/or backing sheet, additional coatings and layers can be employed, such as a weatherability coating (e.g., having UV absorbing or blocking properties), and abrasion resistance layer, and so forth.

Figure 43:
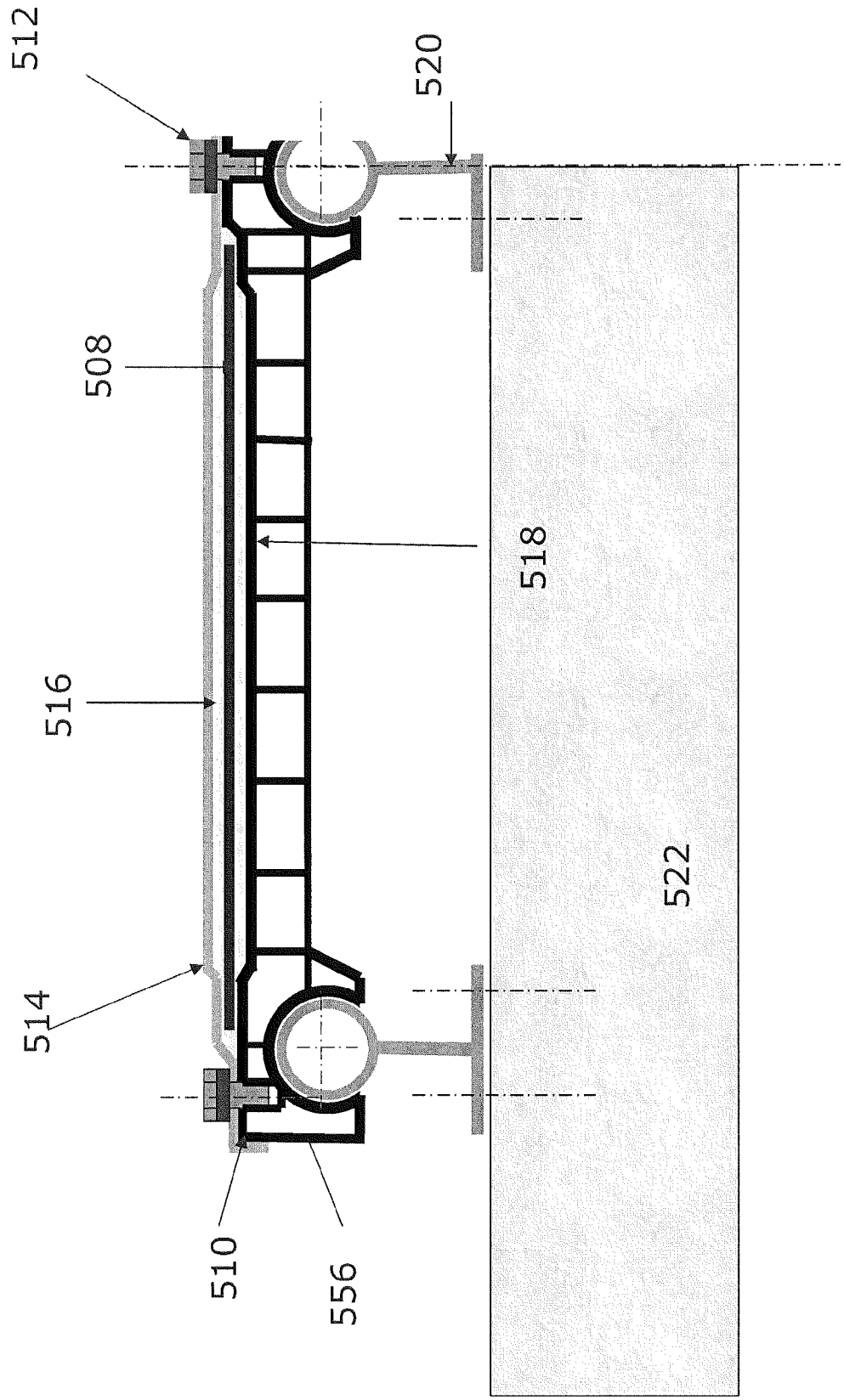
FIG. 43 is a cross sectional taken in the direction illustrated as A-A in FIG. 36 illustrating a roof with an embodiment of a photovoltaic panel.

FIG. 43 is an example of a panel comprising a PV module attached to a roof, with the perspective consistent with A-A of FIG. 36. The panel comprises solar cell array 508 disposed between a back sheet 518 and a cover sheet 514. Desirably, the cover sheet 514 and/or the back sheet 518, extend past the solar cell array 508 to form a flange 524 that can be attached to the panel and optionally located on the panel without extending into the connectors (e.g., not in the slot of the connectors). Where the PV module is formed on the panel, the panel can be the back sheet. Optionally, the cover sheet 514 and the back sheet 518 are connected together about their periphery and the PV module then attached to the panel.

The cover sheet (also referred to herein as the front sheet) 514 can be attached to the panel 556 by chemical attachment 510 (e.g., with adhesive, bonding agents, etc.) and/or mechanical attachment 512 (e.g., bolt, screw, rivet, snap fit mechanism, and so forth). Where chemical attachment is employed, the attachment can be any adhesive having sufficient structural integrity and compatibility with the first layer and the second layer to inhibit delamination. For example, the adhesive tape can have an adhesive strength of greater than or equal to about 0.1 megaPascals (MPa), or, more specifically, greater than or equal to about 0.2 MPa, as determined in accordance with ISO 4587-1979 (Adhesives—Determination of tensile lap shear strength of high strength adhesive bonds). The elongation at break of the adhesive tape can be greater than or equal to about 50%, or, more specifically, greater than or equal to about 80%, or, even more specifically, greater than or equal to about 95%, as measured in accordance with ISO 4587-1979 (Adhesives—Determination of tensile lap shear strength of high strength adhesive bonds). An example of chemical attachments include acrylic tape, silicone, polyurethane glue, and so forth, such as a silicone adhesive commercially available from Bostic, Inc., Middleton, Mass.; HPA 1905W crosslinked acrylic based adhesive commercially available from Avery Dennison, Turnhout, Belgium; and 3M™ High Performance Adhesive Transfer Tapes with Adhesive 200 MP, commercially available from 3M™, St. Paul, Minn. Although both chemical attachment 510 and mechanical attachment 512 are illustrated for convenience, either the chemical attachment 510 or the mechanical attachment 512, or both can be present.

The cover sheet 514 is transparent so as to enable the solar radiation contact the solar cells, e.g., a transparency of greater than or equal to 60%, specifically, greater than or equal to 75%, and more specifically, greater than or equal to 85%. As used herein, transparency is determined per ASTM D-1003-00 (Procedure B, Spectrophotometer, using illuminant C with diffuse illumination with unidirectional viewing), on a 2.5 mm thick sample. Possible cover layers include glass, polymers, and combinations comprising at least one of the foregoing. Possible polymers include, but are not limited to, oligomers, polymers, ionomers, dendrimers, copolymers such as block copolymers, graft copolymers, star block copolymers, random copolymers, and combinations comprising at least one of the foregoing having the desired optical properties for a PV application. Examples of such polymers resins include, but are not limited to, polycarbonates (e.g., polycarbonate-polybutadiene blends, blends of polycarbonate, copolyester polycarbonates), polystyrenes (e.g., copolymers of polycarbonate and styrene), acrylonitrile-styrene-butadiene, polyphenylene ether-polystyrene resins, polyalkylmethacrylates (e.g., poly(methyl methacrylates)), polyesters (e.g., copolyesters, polythioesters), polyolefins (e.g., polypropylenes and polyethylenes such as high density polyethylenes, low density polyethylenes, linear low density polyethylenes, poly(ethylene terephthalate) (PET)), polyamides (e.g., polyamideimides), polyethers (e.g., polyether ketones, polyether etherketones, polyethersulfones), fluoropolymer film (e.g., such as ethylene tetrafluoroethylene (ETFE), fluorinated ethylene propylene (FEP), perfluoroalkoxy (PFA), polyvinyl fluoride (PVF), polyvinylidene fluoride (PVDF)), polychlorotrifluoroethylene (PCTFE)), and combinations comprising at least one of the foregoing.

More particularly, the polymer can comprise polycarbonate resins (e.g., LEXAN™ resins, commercially available from SABIC Innovative Plastics), polyphenylene ether-polystyrene resins (e.g., NORYL™ resins, commercially available from SABIC Innovative Plastics), polyetherimide resins (e.g., ULTEM™ resins, commercially available from SABIC Innovative Plastics), polybutylene terephthalate-polycarbonate resins (e.g., XENOY™ resins, commercially available from SABIC Innovative Plastics), copolyestercarbonate resins (e.g. LEXAN™ SLX resins, commercially available from SABIC Innovative Plastics), and combinations comprising at least one of the foregoing resins. Even more particularly, the thermoplastic resins can include, but are not limited to, homopolymers and copolymers of: a polycarbonate, a polyester, a polyacrylate, a polyamide, a polyetherimide, a polyphenylene ether, or a combination comprising at least one of the foregoing resins. The polycarbonate can comprise copolymers of polycarbonate (e.g., polycarbonate-polysiloxane, such as polycarbonate-polysiloxane block copolymer), linear polycarbonate, branched polycarbonate, end-capped polycarbonate (e.g., nitrile end-capped polycarbonate), and combinations comprising at least one of the foregoing, for example a combination of branched and linear polycarbonate.

The back sheet 518 is opaque (e.g., having a transmission of less than 30%, specifically, less than 20%, more specifically, less than 10%, and even more specifically, less than 5%). Possible back sheets comprise any of the above materials employed for the cover sheet, wherein the material can be made to be opaque via the addition of an additive, other polymer, and/or by processing. For example, the back sheet 518 can comprise polycarbonate (PC), polyphenylene oxide (PPO), polystyrene (PS), as well as combinations comprising at least one of the foregoing, such as Noryl™ PPO/PS resin commercially available from SABIC's Innovative Plastic business.

Figure 44:
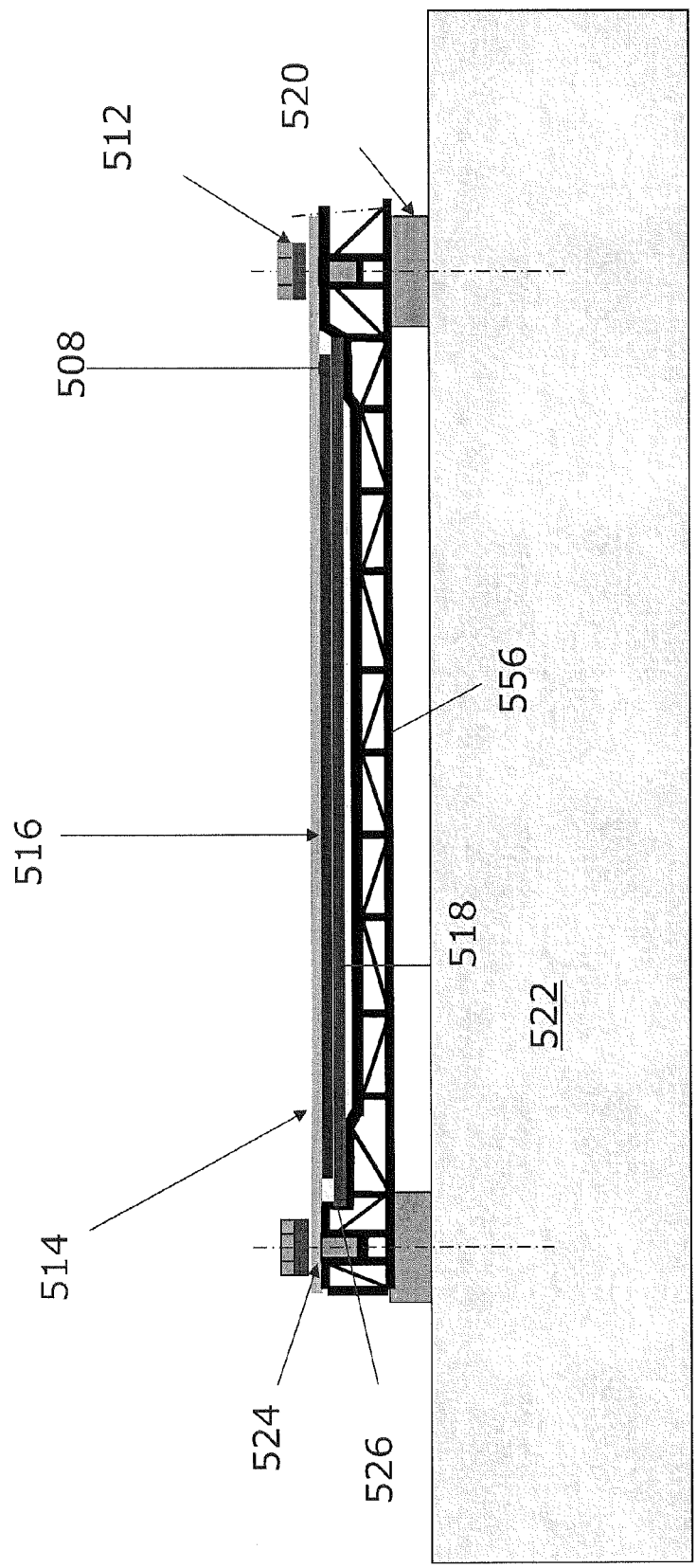
FIG. 44 is a cross sectional taken in the direction illustrated as A-A in FIG. 36 illustrating a roof with another embodiment of a photovoltaic panel.
Figure 45:
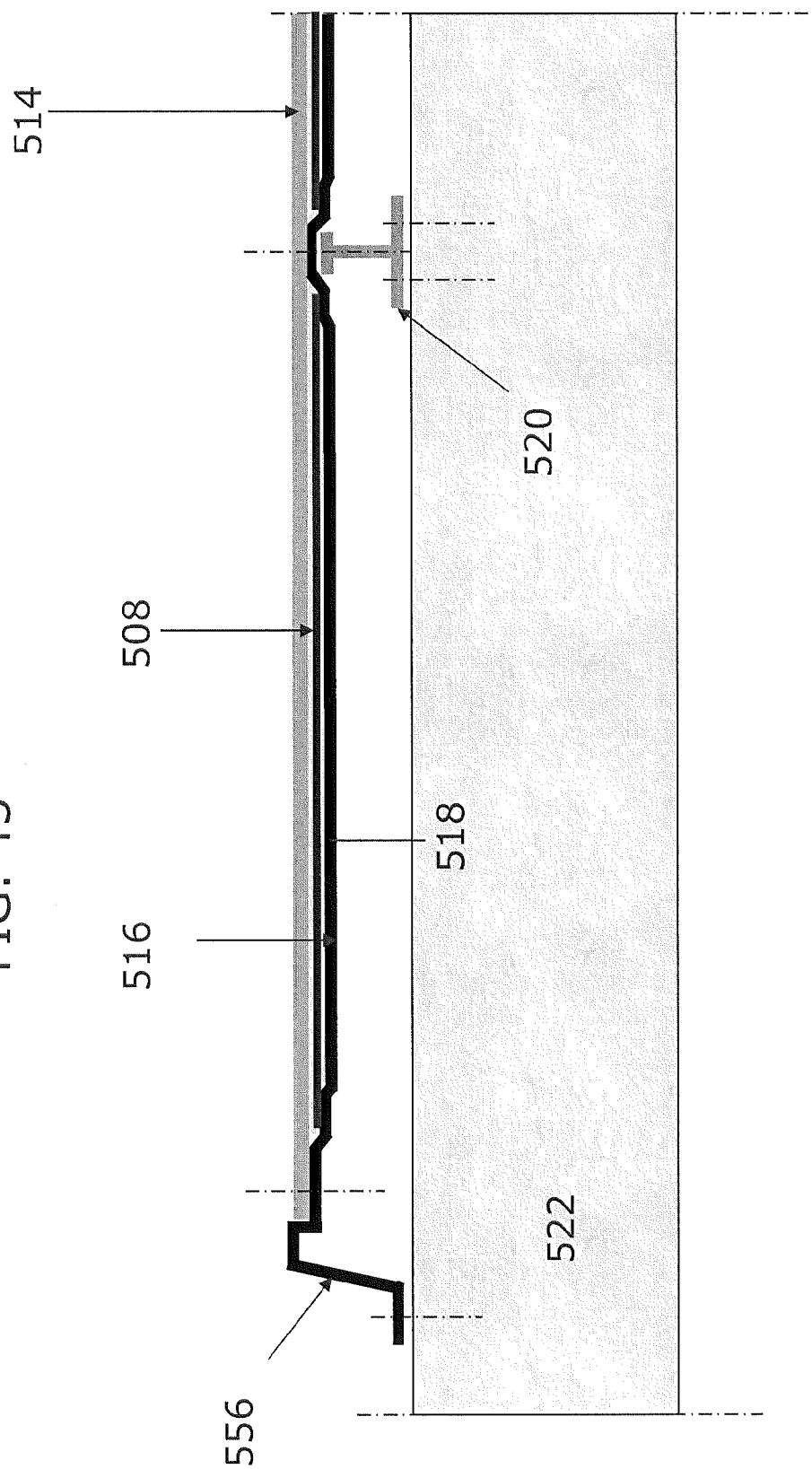
FIG. 45 is a cross sectional illustration of roof with another embodiment of a photovoltaic panel.

The backing sheet 518 is optional as the panel can be the backing sheet such as in the embodiments illustrated in FIGS. 43 and 45. FIGS. 36 and 44 illustrate backing sheets, wherein the PV module would be attached to a panel as is illustrated in FIG. 44.

An encapsulant 516 can be located between the cover sheet 514 and the solar cell array 508 and/or between the back sheet 518 and the solar cell array 508, or both. Possible encapsulants include materials that exhibit hydrolysis resistance, transparency, weather resistance, temperature resistance, light weight. Some examples of encapsulants include: ethylene vinyl acetate (EVA) (e.g., partially oxidized EVA, functionalized EVA, crosslinked EVA), thermoplastic polyurethane, polyvinyl butyral, silicone resin (e.g., room temperature vulcanize (RTV) silicone, silicone oil, and/or rubber or thermoset elastomer silicone and/or other silicone adhesives), ester resin, olefin resin (e.g., maleic acid-modified polyolefin resin), and others, including combinations comprising at least one of these encapsulants. If the front sheet comprises polycarbonate, desirably, the encapsulant is free of hindered amines.

As can be seen from FIG. 44, the panel can be designed such that a flat front sheet 514 can be disposed over the solar cells 508. In other words, the front sheet 514 extends across a surface of the panel 556 without bending (i.e., without a change in angle out of the plane of the sheet by more than 5°), and can optionally wrap around a corner of the panel (see FIG. 43). Optionally, the panel 556 can comprise a recess 526, to accommodate the thickness of the PV module such that the cover sheet 514 can be flat (e.g., can accommodate the solar cell array 508, encapsulant 516, and any additional layers and/or coating, such as a backing sheet)

Figure 48:
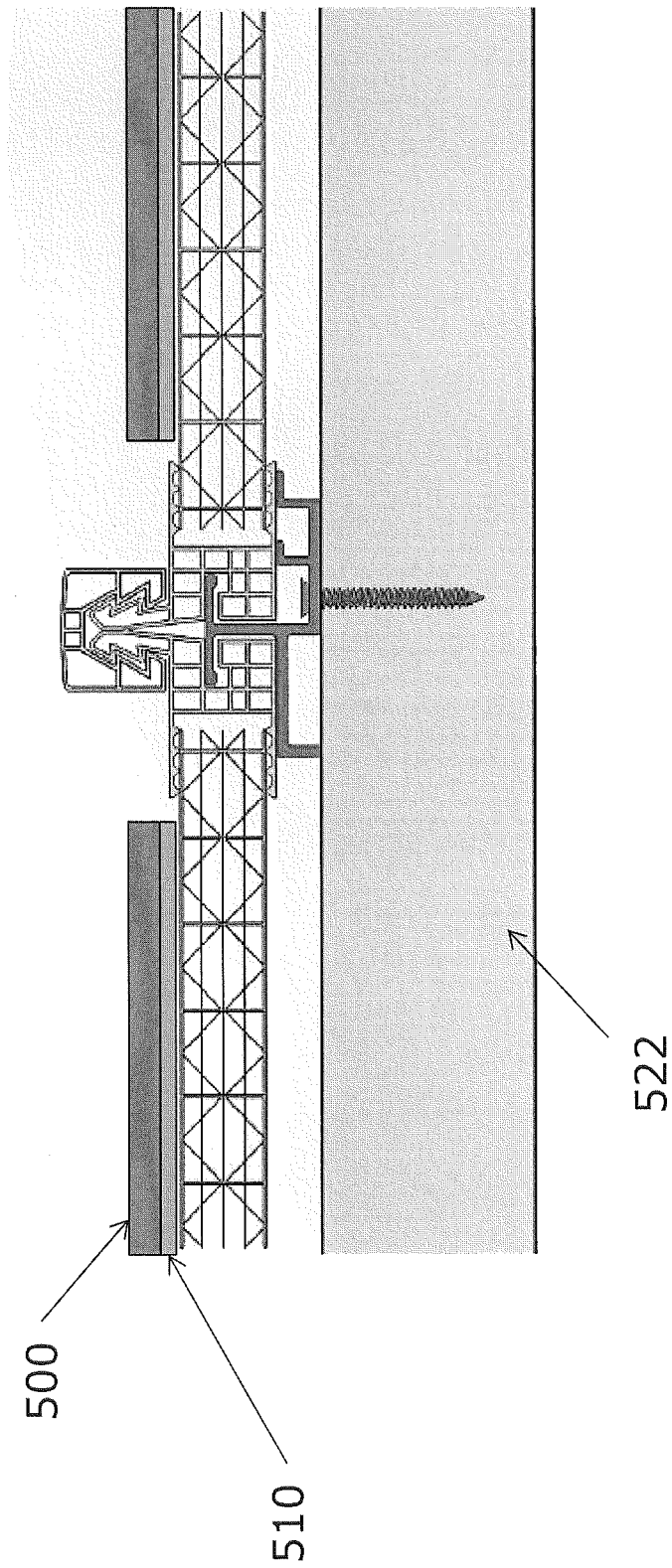
FIG. 48 is a cross sectional illustration of the assembly of FIG. 12 with the clip of FIG. 11 showing PV modules bonded to panels creating an integrated photovoltaic roofing system.

The panel 556 is attached to a roof 520 via profiles 520. Optionally, any of the connectors disclosed herein can be employed with the photovoltaic panels 500. The connector assemblies would be attached to the PV panel (comprising the PV module) in the same manner as the connector assemblies would attach to a panel without a PV module. This is exemplified in FIG. 48 which shows an assembly of FIG. 12 with the clip of FIG. 11 and PV modules bonded to panels creating an integrated photovoltaic roofing system.

The PV module can be preformed, or can be formed directly on the panel. A possible forming method include lamination, e.g., at room temperature, or at an elevated temperature (e.g., at a temperature of 50° C. to 100° C.). For example, encapsulant can be disposed on a back sheet or cover sheet. The solar cell array can be disposed onto the encapsulant, and additional encapsulant can be disposed over the solar cell array. Then, the other sheet (cover sheet or back sheet) can be disposed over the encapsulant. Optionally, other layers can be disposed between the encapsulant and the cover sheet, back sheet, or both. If the PV module is formed on the panel, if a back sheet is used, it can be disposed on the panel, with an optional adhesive between the backing sheet and the panel, and then the encapsulant can be applied. If no additional back sheet is used, the encapsulant can be applied to the panel. The solar cell array can then be disposed on the encapsulant, and again, additional encapsulant can be applied over the solar cell array. Finally, the cover sheet can be disposed over the additional encapsulant. Adhesive can optionally be applied around the periphery of the cover sheet to enhance its attachment to the panel.

Once the side collector is attached to the panel (or if it is integral) assembly of the panels with the connector assembly can comprise inserting a clip into the side collector (e.g., where it engages the rectangular cut out). In other words, sliding the cross-member into the opening in the side collector. The clip can then be fastened to the support. A second panel, with side collector attached, can be slid up against the first panel so that the two touch or are in close proximity and so that the side collector of the second panel engages the clip. Finally, the connector is attached to the extended legs of the side collectors (i.e., to the connector engagement region) to secure everything together.

The connector(s), collectors, and clips can be formed using various techniques, such as extrusion (e.g., a metal/plastic co-extrusion (i.e., pultruded metal with encapsulated metal parts with plastic), a plastic coextrusion with a cap layer (e.g., for ultraviolet protection, and so forth)). Metal pultrusion with encapsulated metal parts with plastic can be used to attain enhanced rigidity to withstand very high forces such as hurricane force winds. The metal could be incorporated in the area(s) of the plastic. For example, referring to FIGS. 41 and 42, the metal 260 (e.g., coextruded metal) could be coextruded with the plastic to provide enhanced structural integrity to the arms 230, opening 212, and/or part or all of the joint side of the collector (e.g., from the bottom to the opening 212). In some embodiments, the metal is coextruded in the area of one or both arms, and/or along the base 258, and/or along the joint wall 254. The metal can extend up the joint wall 254 along the entire body portion, and/or from the base 258 up to and/or through the opening 212 (if present). In some embodiments, the metal is coextruded along the base and joint wall, but not along the arms.

An advantage of the methods disclosed herein is that bonding secondary elements (e.g., collectors) to either multiwall or solid sheet products relying on adhesive systems are messy and have an extensive manual element. Ultrasonic welding techniques without energy directors employed in the past resulted in poor bond strength and/or crushed multiwall panels. Other mechanical fastening or heat welding techniques resulted in surface blemishes or other unsightly marks on the materials surface. The technique disclosed herein includes a bonding technique which provides for an intimate bond between similar materials making up the panel and the attachment. The use of the energy directors can facilitate the bond between the attachment elements (the side collector and the panel, the connector and the side collector, etc. (e.g., standing seam leg, tongue, or groove attachment, snap attachment, etc.)). It was discovered that the inclusion of these energy directors enables the use of ultrasonic welding without crushing the multiwall panel or creating a weak bond between two flat polymer surfaces.

Figure 42:
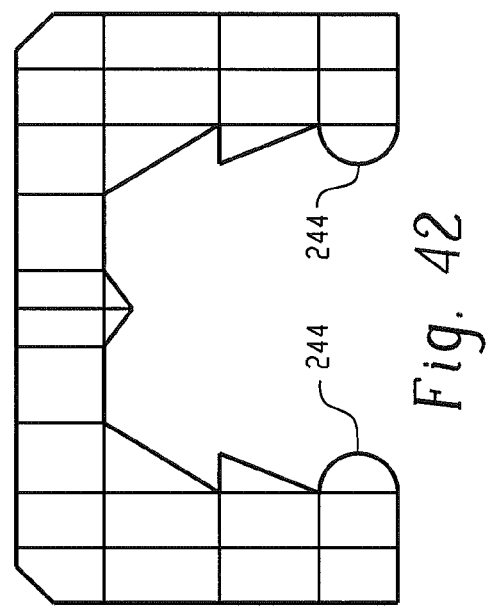
FIG. 42 is a front view of a connector for use with the collector of FIG. 41.
Figure 41:
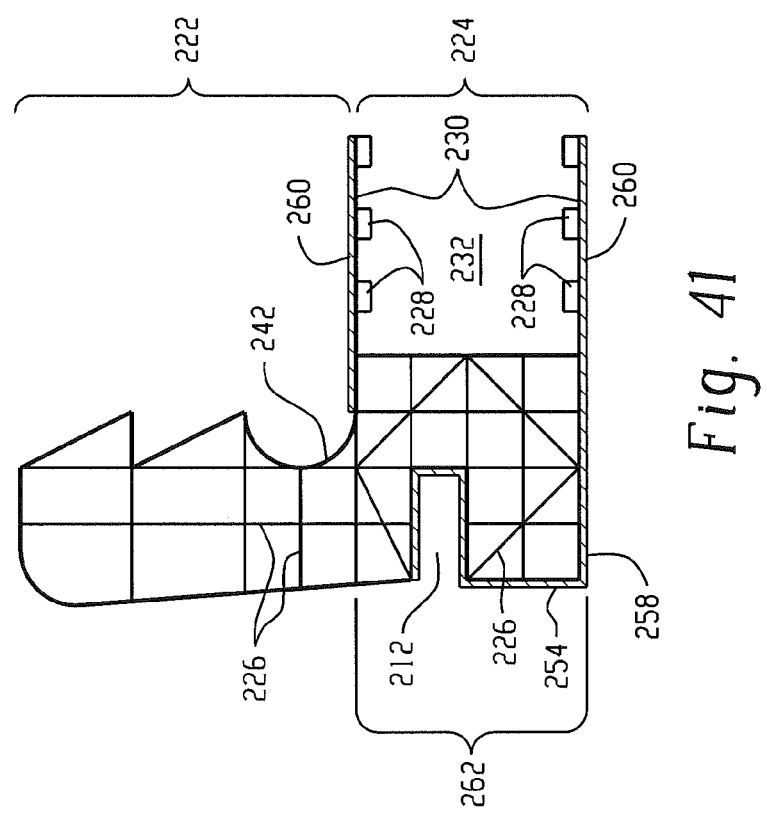
FIG. 41 is a side view of a standing seam side collector.

Also referring to FIGS. 41 and 42, optionally, the side collector(s) and/or connectors can have barrier elements to enable water, air, and/or bug infiltration resistance. These barrier elements can comprise a ridge and a valley, wherein the mating ridge and valley are rounded components. For example, they can form greater than or equal to 40% of a circle, specifically, greater than or equal to 50% (e.g., can form a semicircle). Exemplary barrier elements are illustrated in FIGS. 41 and 42, wherein the barrier valley 242 on FIG. 41 is configured to mate with the barrier ridge 244 on FIG. 42. As is illustrated, the barrier valley 242 can be located on the connector engagement region 222, adjacent to the panel engagement region 224, e.g., in contact therewith.

The various connectors, collectors, and assemblies disclosed herein address the issue of needing expensive aluminum extrusions for connectors. The present assemblies, utilizing various configurations (e.g., mechanical stops and/or extensions) to prevent panel separation can provide enough strength to withstand hurricane force (e.g., 200 mph (322 kilometers per hour (kph)) winds with the use of a plastic connector and collectors, (or the side collectors when no connector is used). The combination of the profile structure and the clips that connects the panels to support (e.g., rafter, etc.) has been modeled to provide enough strength to withstand these high loads.

Additionally, with the separate side collectors, substantial reduction in shipping costs can be attained. Since the panels do not include the side collectors, they can be packaged in a much smaller area, thereby allowing shipping of greater than or equal to 40% more product in the same space.

The connectors, collectors, clips, and assemblies thereof as described herein are further illustrated by the following non-limiting examples.

EXAMPLES

Example 1

Figure 30:
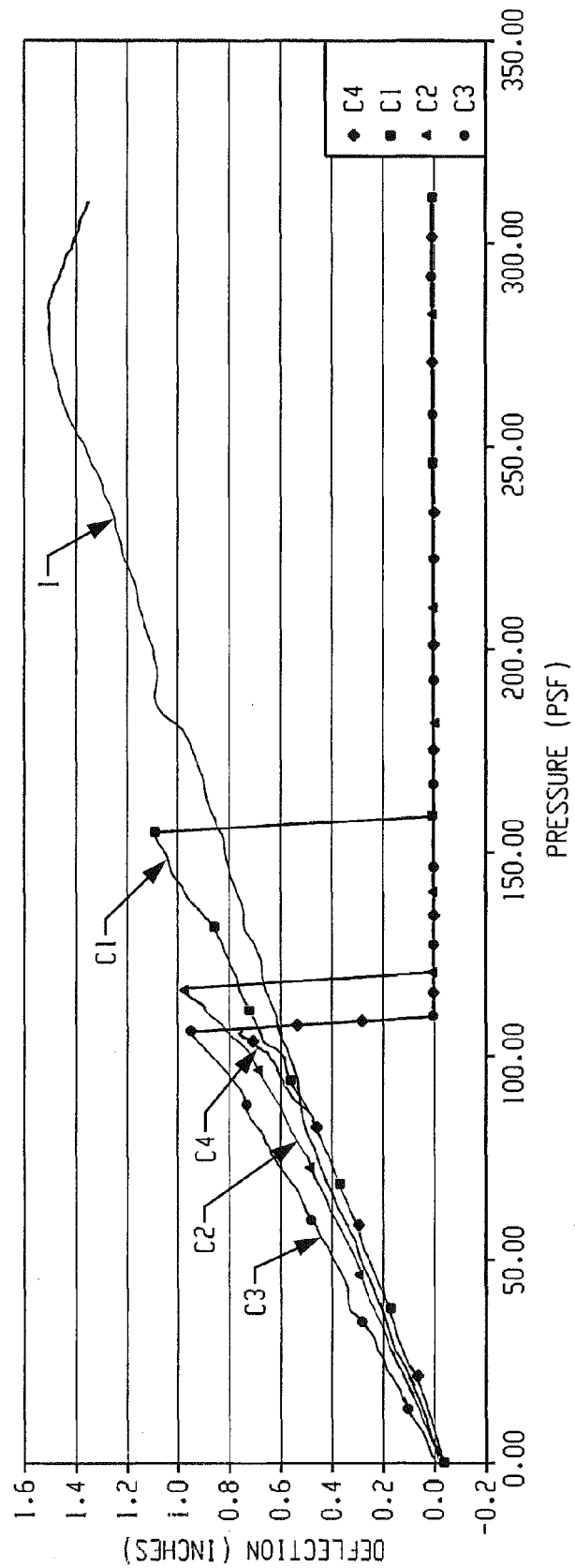
FIG. 30 is a graphical illustration of the deflection versus pressure of a connector assembly having the design of FIG. 38 with various mounting configurations compared to a connector assembly having the design of FIG. 12.

In this example, panels were tested on a 4 foot (ft) by 6 ft box (1.2 meters (m) to 1.8 m) for the ability of the clips and panel assemblies to handle a load. A clip having the design illustrated in FIG. 38, with a flat cross-member was tested and compared to a clip having the design illustrated in FIG. 11 and a panel as illustrated in FIG. 12, with the height of the extensions equal to 0.035 inches (0.889 millimeters (mm)). The panels as tested had a 5 wall X structure. Various configurations were tested as shown in FIG. 30. Comparative Sample 1 (C1) was a connector assembly having a 3 inch (in, 7.6 centimeters (cm)) center bolt clip with a flat cross-member having the design illustrated in FIG. 38; Comparative Sample 2 (C2) was the same as C1 but had a flush mount; Comparative Sample 3 (C3) was also the same as C1, but had a hanging ¾ inch mount; and Comparative Sample 4 (C4) was also the same as C1, but had a steel spacer. FIG. 30 illustrates the deflection (measured in inches) versus pressured (measured in pounds per square foot (lb/ft$^2$)) for the various clip designs and mount.

As can be seen from FIG. 30, it was surprising to discover that a lip having a height of only 0.035 inch (0.889 mm) resulted in a substantial increase in the ability of panels to handle a load. Specifically, the load increased from a maximum of 160 lb/ft$^2$ (7,656 Pa) before break for Comparative Samples 1 to 4 (C1 to C4) without the lip to 325 lb/ft$^2$ (15,550 Pa) for Sample 1 having the lip as herein described. As shown in FIG. 30, Sample 1 did not break, i.e., the clip was able to prevent panel separation. For example, the ability of the panel to handle a load without separation can be increased by greater than or equal to 25%, specifically, greater than or equal to 30%, more specifically, greater than or equal to 35%, even more specifically, greater than or equal to 40%, and yet more specifically, greater than or equal to 50%. In other words, the panel can handle, without separation, a load of greater than or equal to 175 lb/ft$^2$ (8,379 Pa), specifically, greater than or equal to 200 lb/ft$^2$ (9,576 Pa), more specifically, greater than or equal to 250 lb/ft$^2$ (11,970 Pa), and even greater than or equal to 300 lb/ft$^2$ (14,364 Pa).

Figure 29:
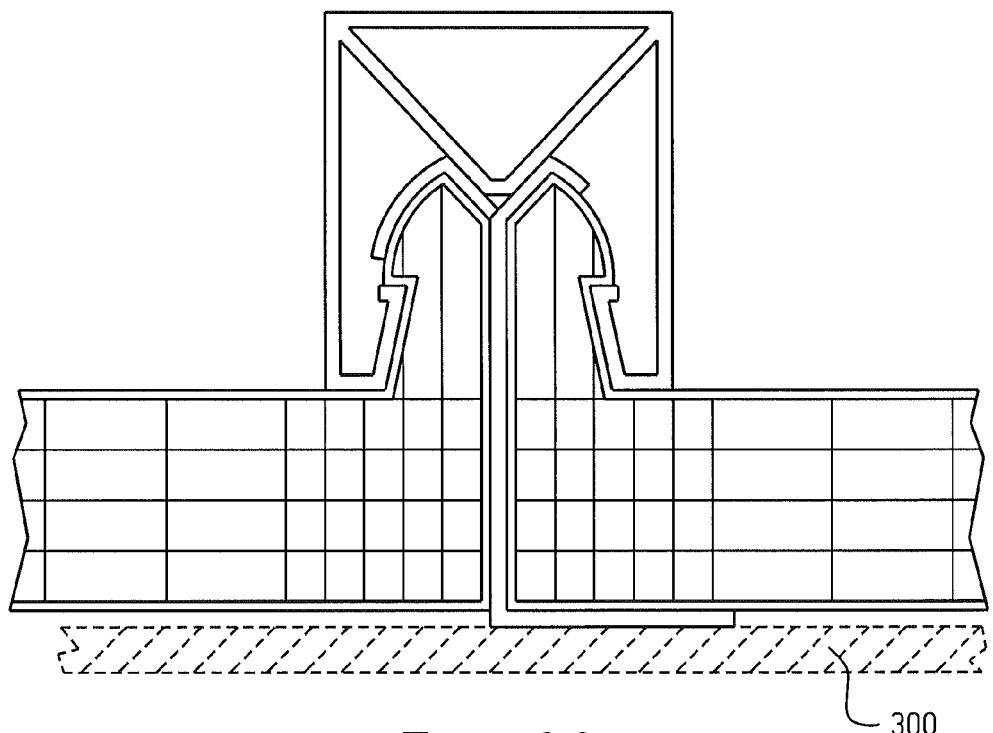
FIG. 29 is a front view of a connector assembly comprising a connector, a clip, and a panel with an integrated side collector.
Figure 31:
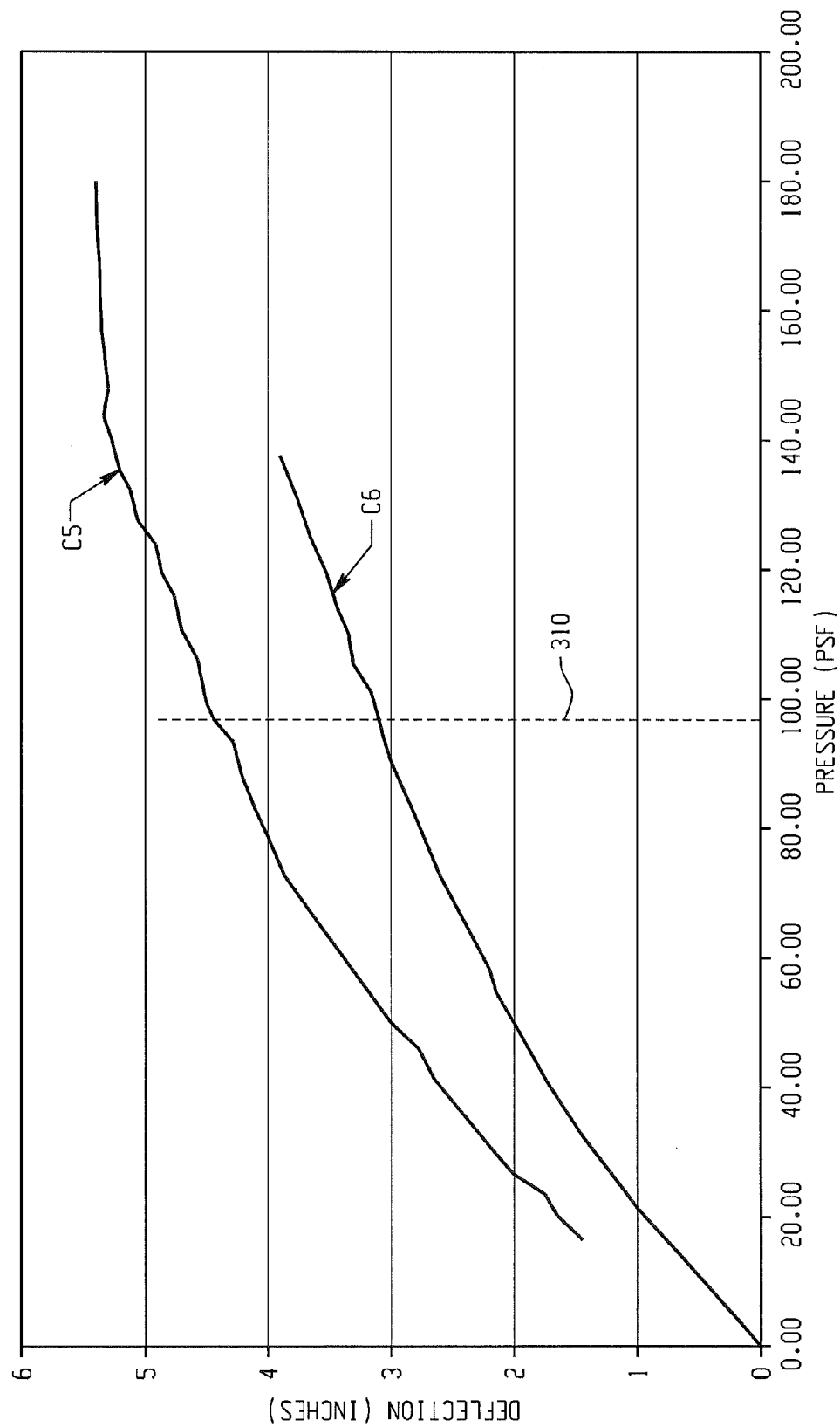
FIG. 31 is a graphical illustration of the deflection versus pressure for a connector assembly having the design of FIG. 29 compared to a connector assembly having the design of FIG. 38.
Figure 32:
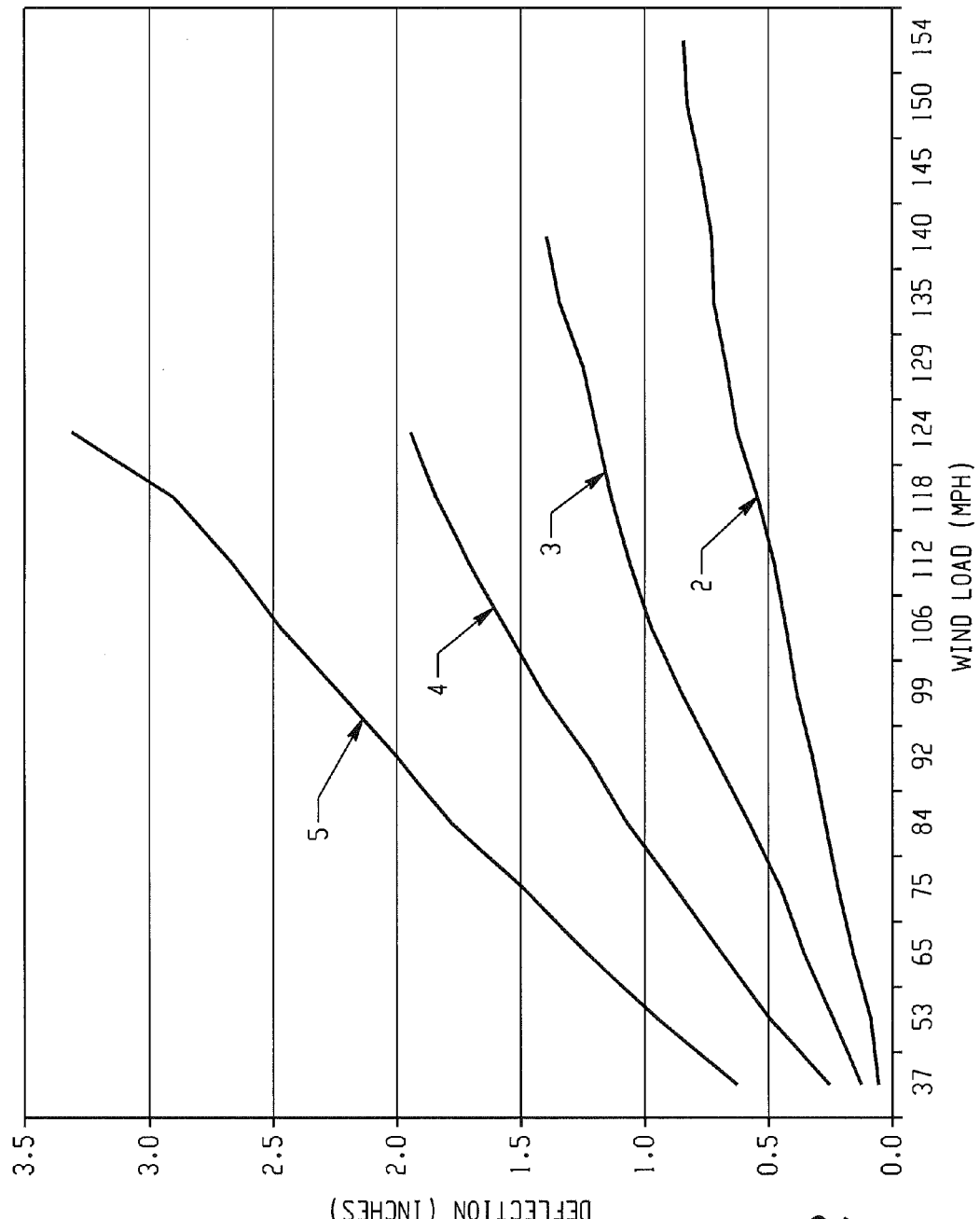
FIG. 32 is a graphical illustration of the deflection versus wind load for various spacing measurements for a connector assembly having the design of FIG. 12 with a 3 foot (0.9 meter) wide panel.
Figure 33:
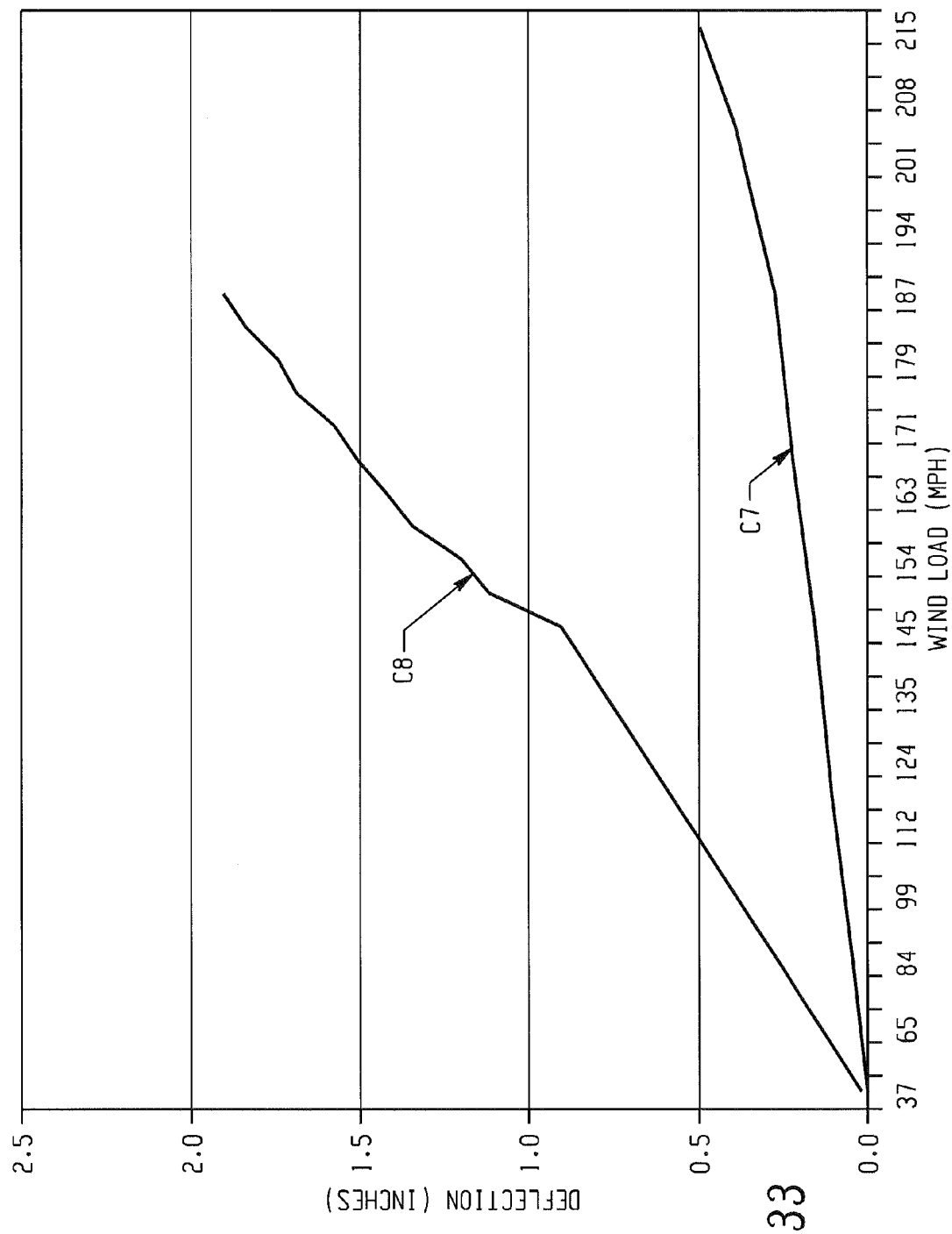
FIG. 33 is a graphical illustration of the deflection versus wind load for various spacing measurements for a connector assembly having the design of FIG. 38 with a 2 foot (0.6 meter) wide panel.
Figure 38:
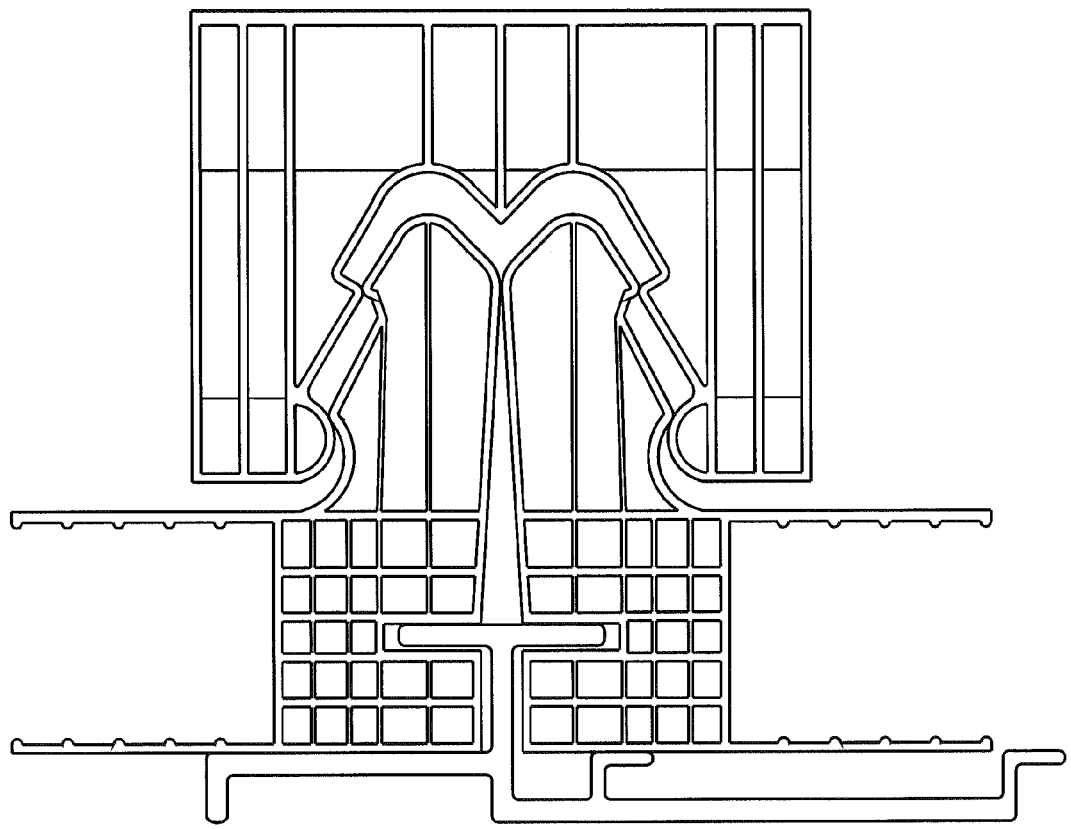
FIG. 38 is a front view of a connector assembly comprising a connector, a clip with a flat cross member, and an integrated side collector.

Comparative Samples C5 and C6 illustrate further results of wind load testing where a panel with a connector assembly having the design illustrated in FIG. 29 was tested for wind load handling capabilities and compared to a panel having the connector assembly design illustrated in FIG. 38. A wind load of 200 mph (322 kph) is indicated by line 310 in FIG. 31. As can be seen from FIG. 31, at wind loads of greater than or equal to 200 mph (322 kph), Comparative Sample 5 (C5) and Comparative Sample 6 (C6) had increasing deflection where C5 failed at a pressure of about 180 lb/ft$^2$ (8,618 Pa) and C6 failed at a pressure of about 140 lb/ft$^2$ (6,703 Pa), where failing refers to the panel separation in the case of sample 6 (C6) and the clip bending non-elastically and allowing the panels to disassemble from the clip in the case of sample 5 (C5). This example demonstrates that without the clip design with a lip as described herein, the panel assemblies could separate and fail under wind loading greater than or equal to 200 mph (322 kmh).

Example 2

In this example, panels having the connector assembly design illustrated in FIG. 38 and FIG. 12 were tested and compared at various wind loads. The panels as tested had a 5 wall X structure. Comparative Samples C7 and C8 (FIG. 33) had the connector assembly design illustrated in FIG. 38, while all the other samples in FIGS. 32, 34, and 35 had the connector assembly design illustrated in FIG. 12. Table 1 lists the data observed from the wind load testing of Samples 2 to 5, while Table 2 lists the data observed from the wind load testing of Comparative Samples C7 and C8. Tables 3 and 4 list the data observed from the wind load testing of Samples 6 to 11. FIGS. 32, 33, 34, and 35 graphically illustrate the results, with FIG. 33 belonging to the Comparative Samples and FIGS. 32, 34, and 35 belonging to the samples having the design illustrated in FIG. 12. Wind speed is measured in mph and deflection is measured in inches (in).

TABLE 1

Sample Data for 3 ft (0.9 m) Standing Seam Panel

| Sample No. | Purlin Spacing | Wind Load at failure |
|---|---|---|
| 2 | 3 ft, 0.9 m | 152 mph, 244 kph |
| 3 | 4 ft, 1.2 m | 138 mph, 222 kph |
| 4 | 5 ft, 1.5 m | 120 mph, 192 kph |
| 5 | 6 ft, 1.8 | 120 mph, 192 kph |

TABLE 2

Comparative Sample Data for 2 ft (0.6 m) Wide Standing Seam Panel

| Sample No. | Purlin Spacing | Wind Load at failure |
|---|---|---|
| C7 | 3 ft, 0.9 m | 215 mph, 346 kph |
| C8 | 5, 1.5 m | 187 mph, 300 kph |

The results in Table 2, specifically, C7 can be compared to Sample 10 in Table 4 and will be discussed in further detail. C7 had a larger batten and side collector than other samples, so it was able to sustain a higher wind load than other samples because the larger batten and side collector added stiffness to the panel.

Figure 34:
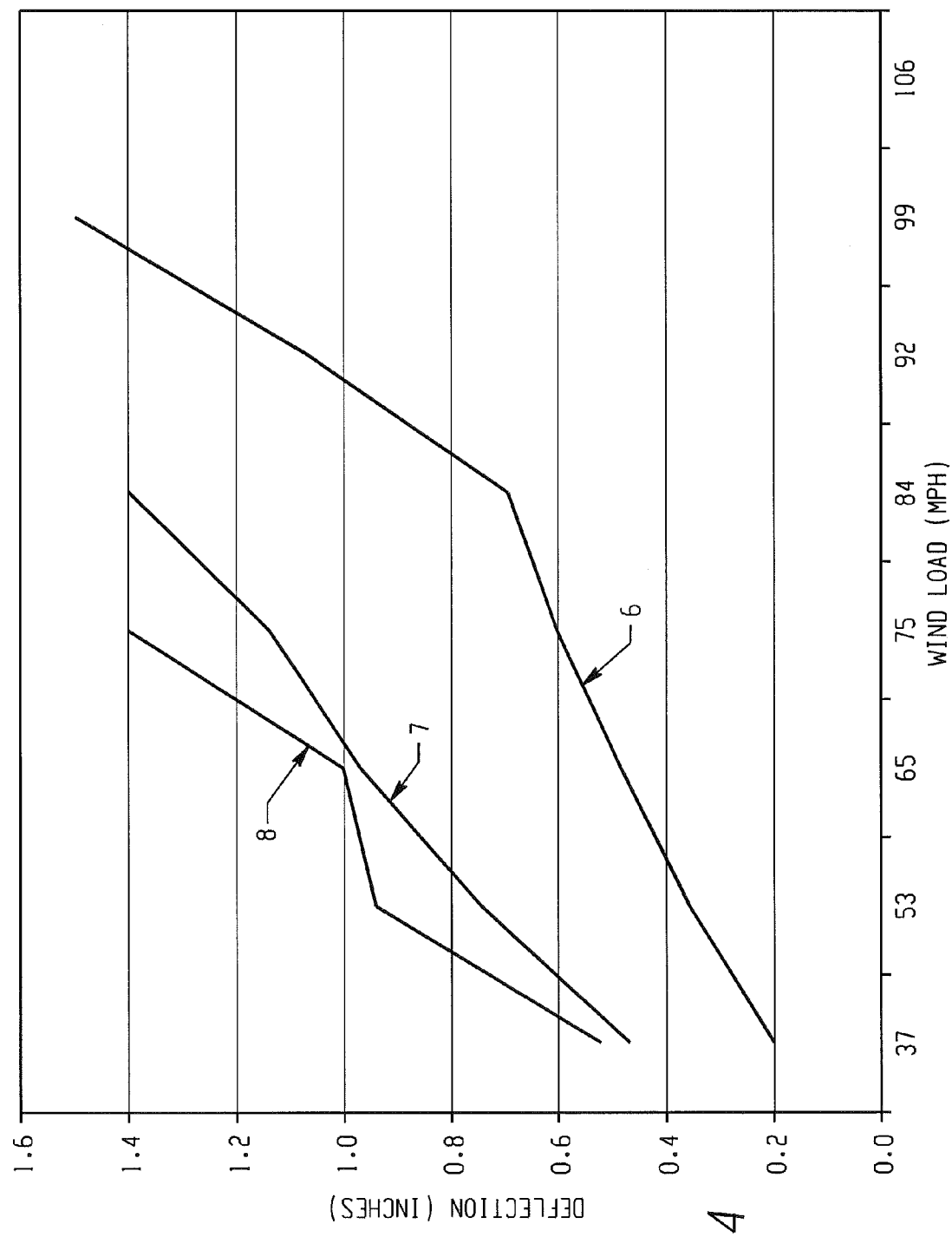
FIG. 34 is a graphical illustration of the deflection versus wind load for various spacing measurements for a connector assembly having the design of FIG. 12 with a 4 foot (1.2 meters) wide panel.
Figure 35:
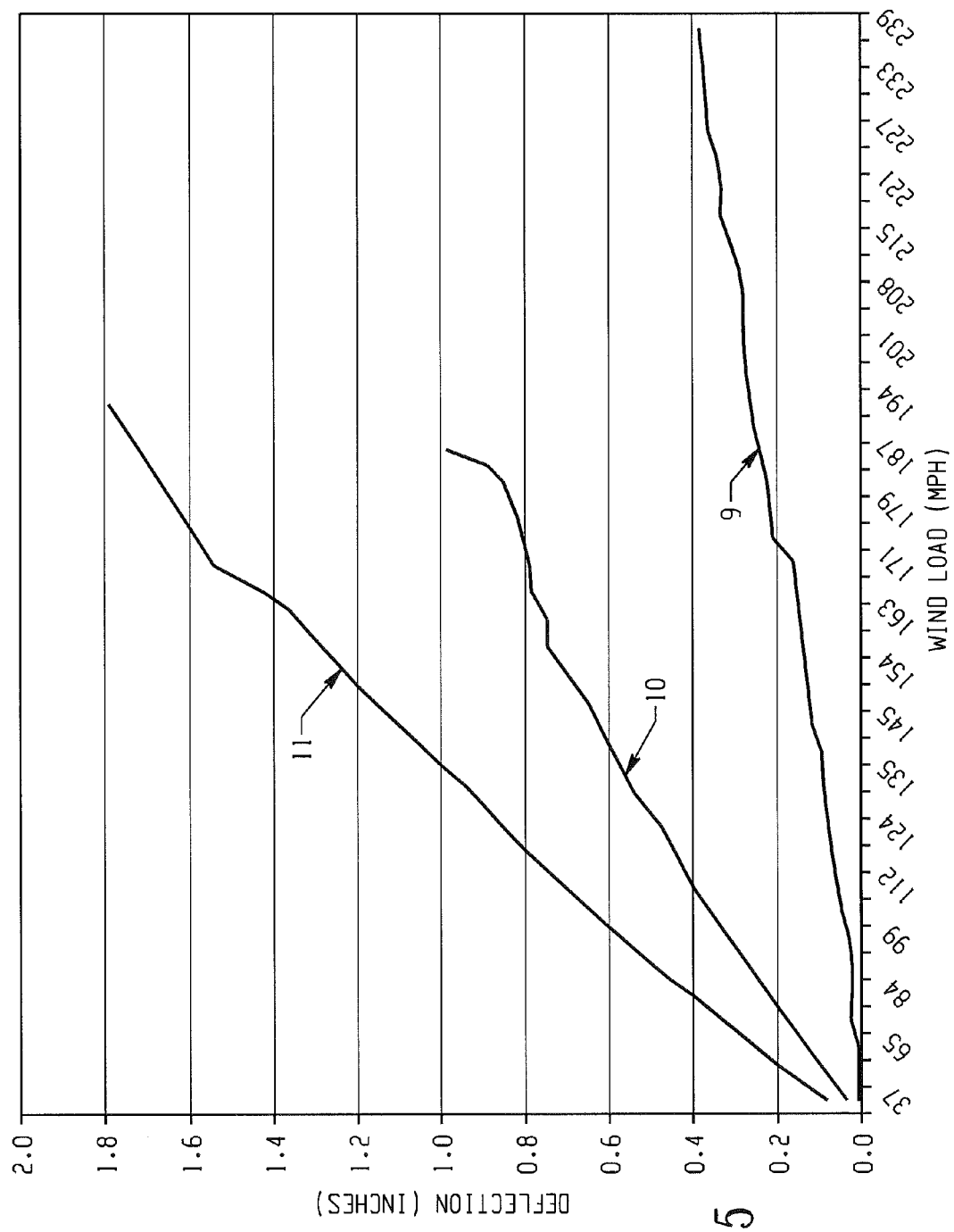
FIG. 35 is a graphical illustration of the deflection versus wind load for various spacing measurements for a connector assembly having the design of FIG. 12 with a 2 foot (0.6 meter) wide panel.

Table 3 lists the data from testing 4 foot (1.2 m) wide panels and FIG. 34 illustrates the results. Samples 6 to 8 have the connector assembly and clip design illustrated in FIG. 12. As can be seen from Table 3 and FIG. 34, as the purlin spacing increases, the wind speed and load that the connector assembly can resist is reduced. Additionally, the mode of failure changed from the samples tested in Table 2 compared to those in Tables 1, 3 and 4. For example, the failure mode for the samples in Table 2 was due to the panel slipping off the clip, while the failure mode in Table 3 was due to failure of the clip, demonstrating that a stronger clip can potentially allow for even high wind speeds to be withstood than those tested. The failure mode for the samples in Table 1 was tearing of the clip through the panel, which demonstrates the maximum load the panel can sustain.

TABLE 3

Data for 4 ft (1.2 m) Wide Panels

| Sample No. | Purlin Spacing (ft) | Deflection Type | Wind Speed at failure |
|---|---|---|---|
| 6 | 4 | Seam | 99 mph, 160 kph |
| 7 | 5 | Seam | 87 mph, 140 kph |
| 8 | 6 | Seam | 75 mph, 120 kph |

Table 4 illustrates data for Samples 9 to 11, where Sample 9 had a full length, 18 foot (5.5 m) long clip and Samples 10 and 11 had a 3 inch (7.6 cm) long clip. Full length clip refers to a clip having the design illustrated in FIG. 11 and extending the full length of the panel, i.e., 18 feet (5.5 m), while the clip used in Samples 10 and 11 also have the design in FIG. 11, but had a length of 3 inches (7.6 cm). As can be seen in Table 4 and corresponding FIG. 35, the full clip can handle higher wind loads as compared to a clip having a length of 3 inches (7.6 cm). For example, the full clip (i.e., 18 foot (5.5 m)) can handle wind loads greater than or equal to 200 mph (322 kph), specifically greater than or equal to 225 mph (362 kph), and even more specifically, greater than or equal to 240 mph (386 kph) before failing, while the 3 inch (7.6 cm) clip can handle wind loads greater than or equal to 150 mph (240 kph), specifically, greater than or equal to 175 mph (282 kph), and even more specifically, greater than or equal to 185 mph (298 kph).

TABLE 4

Data for 2 ft (0.6 m) Wide Standing Seam Panels

| Sample No. | Purlin Spacing (ft) | Clip Type | Deflection Type | Wind Speed |
|---|---|---|---|---|
| 9 | 3 | 18 ft (5.5 m) | Seam | 240 mph, 386 kph |
| 10 | 3 | 3 in (7.6 cm) | Seam | 187 mph, 300 kph |
| 11 | 4 | 3 in (7.6 cm) | Seam | 194 mph, 312 kph |

As mentioned, C7 in Table 2 can be compared to Sample 10 in Table 4. C7 illustrates a higher load than that of Sample 10 because C7 had a batten and side collector, having the design illustrated in FIG. 28, that was twice the size of the batten and side collector of Sample 10, having the design illustrated in FIG. 12. The larger batten and side collector size added to the stiffness and load capacity of C7. Despite the increased load, the failure mode of sliding off the clip showed that a higher potential load can possibly be achieved through modification of the clip and panel interface. For example, in Sample 10, the failure mode was failure of the clip due to fracture, which is another indication that a higher potential load can possible be obtained through a modification of the clip to a material with a higher strength. Comparing Sample 11 to C7 and C8 demonstrates that the combination of strengthening the clip and creating a mechanical stop at the interface between the panel and the clip can provide high wind load capability with a lower profile batten and side collector design. Sample 11 had a 4 foot purlin spacing and exceeded the results of Sample 10 with a 3 foot purling spacing. It can be possible for an assembly with the design of Sample 11 to have equivalent wind load handling capability with a batten and side collector design that is half the size of that used in C7. For example, extrapolating the results of Sample 11 to a 3 foot purlin spacing yields a value between 210 and 250 mph, which would be approximately equal to that of C7.

Figure 46:
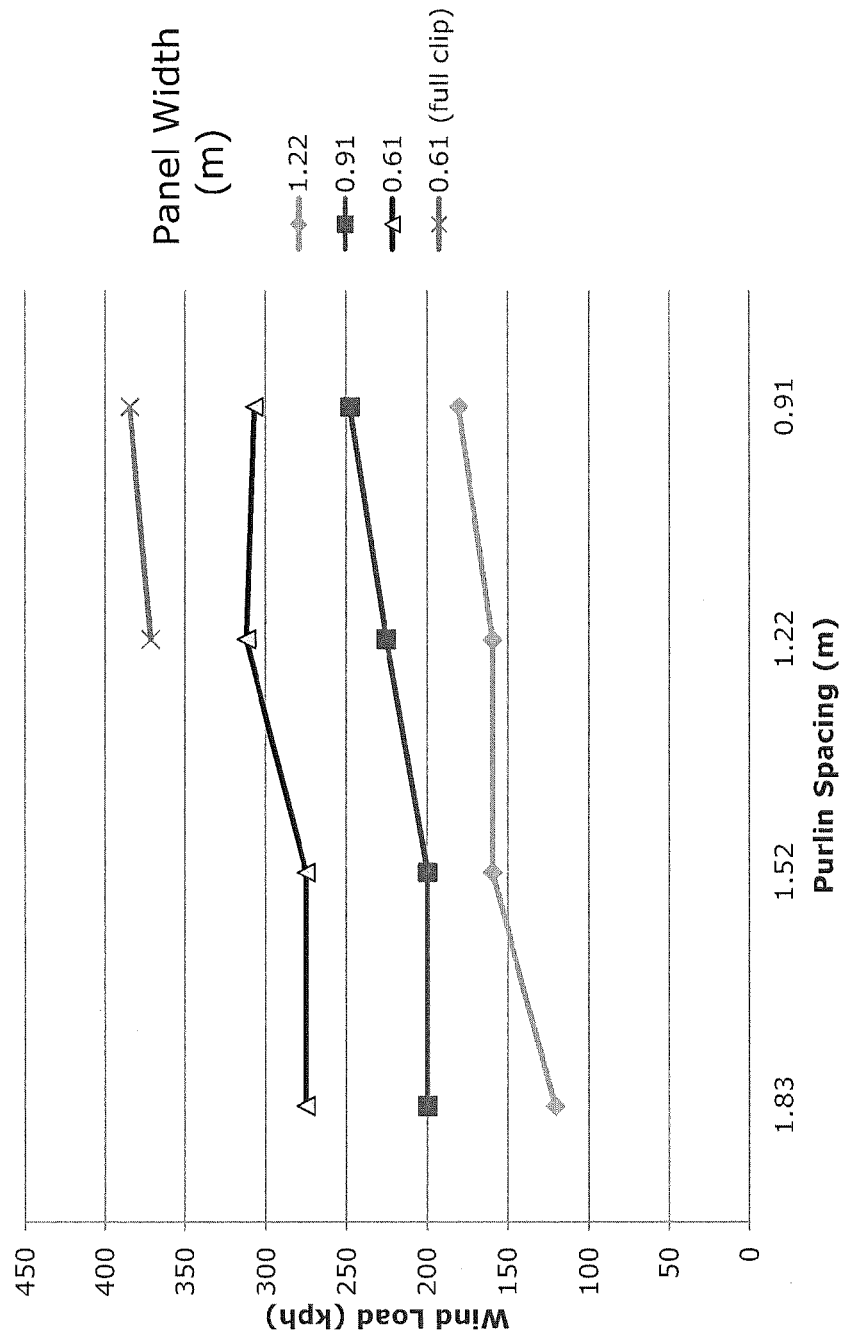
FIG. 46 is a graphical illustration of maximum load to failure showing purlin spacing and panel width versus wind load for a polycarbonate panel.
Figure 47:
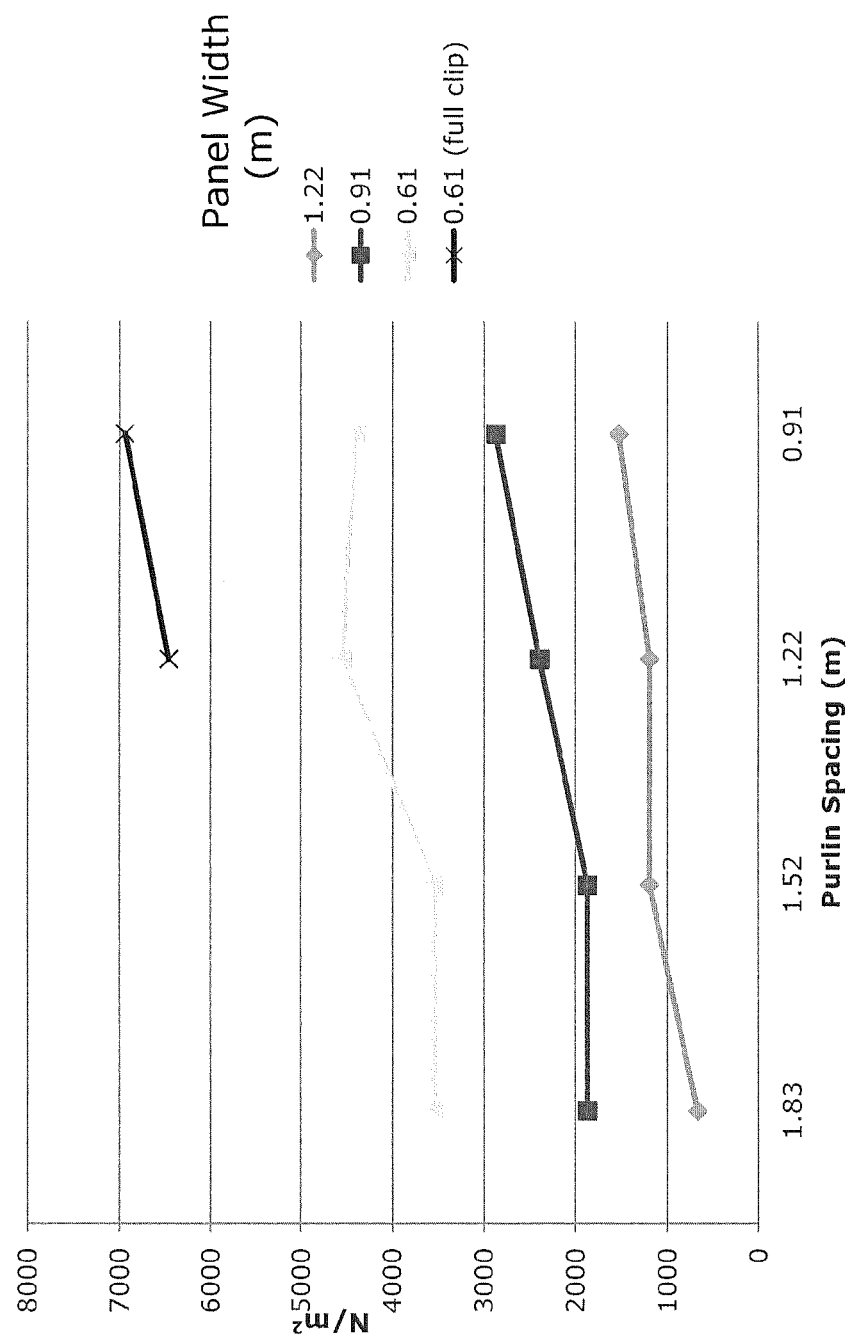
FIG. 47 is a graphical illustration of maximum load to failure showing purlin spacing and panel width versus force for a polycarbonate panel.

FIGS. 46 and 47 further graphically illustrate the advantages of the present connectors. In these figures, samples again had the design illustrated in FIG. 12. As can be seen in FIG. 46, at a panel width of 1.22 m, even at a purlin spacing of 1.83 m, the assembly withstood a wind load of greater than 100 kph, while at a purlin spacing of 1.52 m, the assembly withstood a wind load of greater than 150 kph. At a panel width of 0.91 m, even at a purlin spacing of 1.83 m, the assembly withstood a wind load of greater than 190 kph, while at a purlin spacing of 0.91 m, the assembly withstood a wind load of greater than 240 kph. At a panel width of 0.61, and a purlin spacing of 1.83 m, the assembly withstood a wind load of greater than 250 kph, while at a purlin spacing of 1.22 m, the assembly withstood a wind load of greater than 300 kph. Finally, a panel width of 0.61 m with a full clip, at a purlin spacing of 1.22 m, the assembly withstood a wind load of greater than 350 kph.

FIG. 47 illustrated similar, unexpected, and improved capabilities. Here, at a panel width of 1.22 m, even at a purlin spacing of 1.83 m, the assembly withstood a load of greater than 600 Newtons per square meter ($N/m^2$), while at a purlin spacing of 1.52 m, the assembly withstood a load of greater than 1,000 $N/m^2$. At a panel width of 0.91 m, even at a purlin spacing of 1.83 m, the assembly withstood a load of greater than 1,800 $N/m^2$. At a panel width of 0.61, and a purlin spacing of 1.83 m, the assembly withstood a load of greater than 3,500 $N/m^2$, while at a purlin spacing of 1.22 m, the assembly withstood a load of greater than 2,300 $N/m^2$. Finally, a panel width of 0.61 m with a full clip, at a purlin spacing of 1.22 m, the assembly withstood a wind load of greater than 6,400 $N/m^2$, and at a purlin spacing of 0.91 m, the assembly withstood a wind load of greater than 6,900 $N/m^2$.

It is contemplated that the connector assemblies disclosed herein can be used in the construction of naturally lit structures such as greenhouses, pool enclosures, solar roof collectors (e.g., photovoltaic modules), stadiums and sunrooms, glass panel roofs, and combinations comprising at least one of the foregoing. For example, the connector assemblies can be used to attach photovoltaic modules together. Photovoltaic modules are generally an assembly of the various components of the module, including a first layer, a fluid layer, a second layer, junction box, cables, inverter (e.g., micro-inverter), etc. (see FIG. 36 illustrating a photovoltaic module 500). The connector assemblies described herein can be used to hold photovoltaic modules together to create a solar panel. A method of making a solar panel is also contemplated where the method can comprise attaching a photovoltaic module to another photovoltaic module with any of the designs of the connector assemblies described herein to create a solar panel as shown by example in FIG. 48.

The connector assemblies comprising the various designs of the clip with either the lip or protrusion can be capable of withstanding a higher wind speed and load than connector assemblies with a clip having a flat cross-member. Such a design can enable the connector assemblies to be used in applications where high wind loads (e.g., greater than or equal to 200 mph (322 kph)) can be encountered.

Embodiment 1

A connector assembly, comprising: a connector; and a pair of side collectors, each comprising a connector engagement region having a size and geometry to mate with the connector so as to hold ends of two adjacent panels together; and a panel engagement region comprising a receiving area and having a size to attach onto an edge of the panel; and a clip (10,60), wherein the clip has a base that can be attached to a support, an engagement, and a stem extending therebetween, wherein the engagement has an extension projecting from a side of the engagement, wherein the panel engagement region further comprises an opening in a joint wall on a side of the panel engagement region opposite the receiving area, wherein the opening is configured to receive the extension of the engagement.

Embodiment 2

The connector assembly of Embodiment 1, wherein the opening of the side collector comprises a complimentary geometry to the extension of the engagement, wherein the opening and the extension engage with one another.

Embodiment 3

The connector assembly of any of Embodiments 1-2, wherein the extension penetrates into the opening of the panel engagement region.

Embodiment 4

The connector assembly of any of Embodiments 1-3, wherein the base comprises elements that, when assembled with the connector, collector, and panels, the panels will be level.

Embodiment 5

The connector assembly of any of Embodiments 1-4, wherein the base comprises a section formed by a side, area, and a leg, and wherein the side and leg have a length (l) that is greater than a height of a fastener head, wherein the area extends from one side to another side.

Embodiment 6

The connector assembly of any of Embodiments 1-5, wherein the extension comprises a lip projecting from a side of the engagement and/or comprises a protrusion extending from a side of the engagement.

Embodiment 7

A connector assembly, comprising: a connector comprising two cavities defined by flexible walls, wherein each of the cavities has a geometry and is configured to mate with connector engagement regions (222) from a pair of side collectors; a header located between the two cavities; and a first slot on a side of the connector and between the cavities, wherein the first slot has a size and geometry to receive an end of a panel without a side collector, wherein the cavities enable two sets of panels to be stacked and connected with the connector; and a clip, wherein the clip has a base that can be attached to a support, an engagement, and a stem extending therebetween, wherein the stem diverges to a receiver located on an end of the stem opposite the base, wherein the engagement has an extension projecting from a side of the engagement, wherein a panel engagement region on the side collectors comprises an opening in a joint wall on a side of the panel engagement region opposite a receiving area, wherein the opening is configured to receive the extension of the engagement.

Embodiment 8

The assembly of Embodiment 7, wherein the connector further comprises a second slot on another side of the connector opposite the first slot and between the cavities, wherein the second slot has a size and geometry to receive an end of another panel without a side collector.

Embodiment 9

The assembly of Embodiment 7, wherein a photovoltaic panel is located in the first slot.

Embodiment 10

The assembly of any of Embodiments 7-9, wherein another photovoltaic panel is located in the second slot.

Embodiment 11

The assembly of any of Embodiments 7-10, wherein the clip further comprises members located on a receiver of the clip.

Embodiment 12

The assembly of any of Embodiments 7-11, wherein the header is configured to receive a connecting member that attaches the connector to members of the clip.

Embodiment 13

A panel assembly, comprising: the connector assembly of any of Embodiments 1-12; a panel located in each panel engagement region; and wherein the connector is mated with the connector engagement region of the side collectors so as to hold ends of the panels together.

Embodiment 14

The panel assembly of Embodiment 13, wherein adjacent panels are connected by a mating geometry selected from tongue and groove, standing seam, and snap fit.

Embodiment 15

The panel assembly of Embodiment 13, wherein adjacent panels are connected by a lap joint.

Embodiment 16

The panel assembly of any of Embodiments 13-15, wherein the panel has a front surface, and further comprising: a solar cell array located on the front surface; an encapsulant around the solar cell array; and a cover sheet on a side of the solar cell array opposite the panel, wherein the encapsulant is between the solar cell array and the cover sheet.

Embodiment 17

The panel assembly of Embodiment 16, further comprising a back sheet between and the encapsulant and the panel.

Embodiment 18

The panel assembly of Embodiment 17, wherein the cover sheet, the back sheet, or both comprise poly(ethylene terephthalate).

Embodiment 19

The panel assembly of Embodiment 17, wherein the cover sheet comprises polycarbonate.

Embodiment 20

The panel assembly of any of Embodiments 17-18, wherein the back sheet comprises a material selected from polycarbonate, polyphenylene ether, polystyrene, and combinations comprising at least one of the foregoing.

Embodiment 21

The panel assembly of any of Embodiments 17-20, wherein the back sheet comprises polyphenylene ether-polystyrene resin.

Embodiment 22

A method of making a panel assembly, comprising attaching a first panel to a second panel with a connector assembly of any of Embodiments 1-12.

Embodiment 23

The method of Embodiment 22, wherein at least one of the first panel and the second panel are photovoltaic panels.

Embodiment 24

The method of any of Embodiments 22-23, further comprising: locating a solar cell array located on a front surface of the first panel; locating an encapsulant around the solar cell array; and adhering a cover sheet to the front surface, over the solar cell array.

Embodiment 25

The method of any of Embodiments 22-23, further comprising: forming a photovoltaic module comprising: a cover sheet; a back sheet; a solar cell array located between the cover sheet and the back sheet; an encapsulant around the solar cell array and between the front sheet and the back sheet.

Embodiment 26

The method of Embodiment 25, further comprising, attaching the photovoltaic module to a front surface of the first panel.

Embodiment 27

A side collector, comprising: a connector engagement region comprising a head having a size and geometry to mate with a panel connector; a panel engagement region comprising a receiving area having an energy director extending into the receiving area, and having a size to attach onto an end of the panel; and a clip engagement region comprising an opening, and having a size to accommodate an extension on a side of an engagement of a clip.

Embodiment 28

The side collector of Embodiment 27, wherein the extension comprises a lip projecting from a side of the engagement and/or comprises a protrusion extending from a side of the engagement.

All ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combination" is inclusive of blends, mixtures, alloys, reaction products, and the like. Furthermore, the terms "first," "second," and the like, herein do not denote any order, quantity, or importance, but rather are used to denote one element from another. The terms "a" and "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films) Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A connector assembly, comprising:
   a connector; and
   a pair of side collectors, each comprising
      a connector engagement region having a size and geometry to mate with the connector so as to hold ends of two adjacent panels together; and
      a panel engagement region comprising a receiving area and having a size to attach onto an edge of the panel; and
   a clip wherein the clip has a base that can be attached to a support, an engagement, and a stem extending therebetween, wherein the engagement has an extension projecting toward the base from a side of the engagement, wherein the panel engagement region further comprises an opening in a joint wall on a side of the panel engagement region opposite the receiving area, wherein the opening is configured to receive the engagement.

2. The connector assembly of claim 1, wherein the opening of the side collector comprises a complimentary geometry to the engagement and the extension thereof, wherein the opening and the extension engage with one another.

3. The connector assembly of claim 1, wherein the extension penetrates into the opening of the panel engagement region.

4. The connector assembly of claim 1, wherein the base comprises elements that, when assembled with the connector, collector, and panels, the panels will be level.

5. The connector assembly of claim 1, wherein the base comprises a section formed by a side, area, and a leg, and wherein the side and leg have a length (1) that is greater than a height of a fastener head, wherein the area extends from the side to another side.

6. The connector assembly of claim 1, wherein the extension comprises a lip.

7. A panel assembly, comprising:
   a connector assembly, comprising
      a connector;
      a pair of side collectors, each comprising
         a connector engagement region; and
         a panel engagement region comprising a receiving area; and
      a clip, wherein the clip has a base that can be attached to a support, an engagement, and a stem extending therebetween, wherein the engagement has an extension protruding from a side of the engagement toward the base, wherein the panel engagement region further comprises an opening in a joint wall on a side of the panel engagement region opposite the receiving area, wherein the opening is configured to receive the engagement;
   a panel located in each panel engagement region; and
   wherein the connector is mated with the connector engagement region of the side collectors so as to hold ends of the panels together.

8. The panel assembly of claim 7, wherein adjacent panels are connected by a mating geometry selected from the group consisting of tongue and groove, standing seam, and snap fit.

9. The panel assembly of claim 7, wherein adjacent panels are connected by a lap joint.

10. The panel assembly of claim 7, wherein the panel has a front surface, and further comprising:
    a solar cell array located on the front surface;
    an encapsulant around the solar cell array; and
    a cover sheet on a side of the solar cell array opposite the panel, wherein the encapsulant is between the solar cell array and the cover sheet.

11. The panel assembly of claim 10, further comprising a backing sheet between and the encapsulant and the panel.

12. A method of making a panel assembly, comprising:
    attaching a first panel to a second panel with a connector assembly, wherein the connector assembly comprises:
       a connector; and
       a pair of side collectors, each comprising
          a connector engagement region having a size and geometry to mate with the connector so as to hold ends of two adjacent panels together; and
          a panel engagement region comprising a receiving area and having a size to attach onto an edge of the first panel or the second panel; and a clip, wherein the clip has a base that can be attached to a support, an engagement, and a stem extending therebetween, wherein the engagement has an extension projecting toward the base from a side of the engagement, wherein the panel engagement region further comprises an opening in a joint wall on a side of the panel engagement region opposite the receiving area, wherein the opening is configured to receive the engagement.

13. The method of claim 12, further comprising:
locating a solar cell array located on a front surface of the first panel;
locating an encapsulant around the solar cell array; and
adhering a cover sheet to the front surface, over the solar cell array.

14. The method of claim 12, further comprising, forming a photovoltaic module comprising:
a cover sheet;
a back sheet;
a solar cell array located between the cover sheet and the back sheet;
an encapsulant around the solar cell array and between the front sheet and the back sheet; and
attaching the photovoltaic module to at least one of the first panel and the second panel.

15. The method of claim 14, further comprising, attaching the photovoltaic module to a front surface of the first panel.

16. The connector assembly of claim 1, wherein the clip, the connector, the pair of side collector, or a combination comprising at least one of the foregoing, comprises a polymeric material.

17. The connector assembly of claim 1, wherein the clip comprises a polymeric material.

18. The connector assembly of claim 1, wherein the engagement comprises a cross-member which extends from a side of the stem.

19. The connector assembly of claim 1, where the engagement extends from a side of the stem at an angle of 85° to 95°.

20. The connector assembly of claim 1, wherein the stem has a length that is less than the thickness of the panel.

21. The method of claim 12, further comprising penetrating into a side of the opening with the extension.

22. The connector assembly of claim 1, wherein the extension penetrates into the pair of side collectors and creates a gripping effect to assist the connector assembly from disassembling when under load.

23. The assembly of claim 1, wherein the extension has two walls extending from the engagement toward the base.

* * * * *